(12) United States Patent
Oh et al.

(10) Patent No.: US 10,001,592 B2
(45) Date of Patent: Jun. 19, 2018

(54) BACKLIGHT UNIT, DOUBLE CONE-SHAPED REFLECTOR, DOUBLE CONE-SHAPED REFLECTOR STRIP, ILLUMINATION APPARATUS, AND METHOD OF MANUFACTURING DOUBLE CONE-SHAPED REFLECTOR

(71) Applicant: LUMENS CO., LTD., Yongin-si, Gyeonggi-do (KR)

(72) Inventors: Seung-Hyun Oh, Gwangju-si (KR); Kang-Min Han, Suwon-si (KR); Suk-Min Han, Suwon-si (KR); Seung-Hoon Lee, Yongin-si (KR); Sung-Sik Jo, Yongin-si (KR)

(73) Assignee: LUMENS CO., LTD., Yongin-si (KR)

( * ) Notice: Subject to any disclaimer, the term of this patent is extended or adjusted under 35 U.S.C. 154(b) by 21 days.

(21) Appl. No.: 15/038,427

(22) PCT Filed: Nov. 20, 2014

(86) PCT No.: PCT/KR2014/011212
§ 371 (c)(1),
(2) Date: May 20, 2016

(87) PCT Pub. No.: WO2015/076592
PCT Pub. Date: May 28, 2015

(65) Prior Publication Data
US 2016/0291235 A1 Oct. 6, 2016

(30) Foreign Application Priority Data

Nov. 22, 2013 (KR) .................. 10-2013-0142928
Dec. 9, 2013 (KR) .................. 10-2013-0152514
Dec. 9, 2013 (KR) .................. 10-2013-0152515

(51) Int. Cl.
*F21V 8/00* (2006.01)
*H01L 33/60* (2010.01)
(Continued)

(52) U.S. Cl.
CPC .......... *G02B 6/0031* (2013.01); *G02B 6/0021* (2013.01); *G02B 6/0088* (2013.01);
(Continued)

(58) Field of Classification Search
CPC .. F21S 6/002; F21Y 2105/10; F21Y 2103/10; F21Y 2115/10; G02B 5/001;
(Continued)

(56) References Cited

U.S. PATENT DOCUMENTS 5,156,144 A * 10/1992 Iwasaki ............ A61B 17/22004
367/155
7,654,687 B2 * 2/2010 Tsai ..................... G02B 5/0247
257/98

(Continued)

FOREIGN PATENT DOCUMENTS

JP 2001 023405 A 1/2001
JP 2004-140327 A 5/2004
(Continued)

OTHER PUBLICATIONS

Office Action dated Jul. 29 2015 in Korean Patent Application No. 10-2013-0142928, 3 pgs.
(Continued)

*Primary Examiner* — Hargobind S Sawhney
(74) *Attorney, Agent, or Firm* — Mei & Mark LLP

(57) ABSTRACT

Disclosed herein is a backlight unit including a flat substrate, a light emitting device mounted on the flat substrate, a light guide plate disposed on the flat substrate, and a reflector being inserted to be disposed in a through-hole and having a contacted reflection portion contacted to the light emitting
(Continued)

device and a spaced reflection portion spaced from the light emitting device. The light guide plate may include an inner wall surface defining the through-hole which accommodates the light emitting device. The contacted reflection portion and the spaced reflection portion are configured to reflect light generated in the light emitting device to penetrate into the light guide plate through the inner wall surface.

9 Claims, 15 Drawing Sheets

(51) Int. Cl.
*G02F 1/1335* (2006.01)
*H01L 33/58* (2010.01)

(52) U.S. Cl.
CPC ........ *G02F 1/133603* (2013.01); *H01L 33/60* (2013.01); *G02B 6/0068* (2013.01); *H01L 33/58* (2013.01)

(58) Field of Classification Search
CPC .. G02B 6/0021; G02B 6/0031; G02B 6/0068; G02B 6/0078; G02B 6/0086; G02B 6/0088; G02B 19/0071; G02B 6/0011; G02B 6/005; G02B 6/0066; G02B 6/0073; G02B 19/0066; G02F 1/133603; G02F 1/133602; G02F 1/133605; G02F 1/133606; H01L 33/52; H01L 33/58; H01L 33/60
See application file for complete search history.

(56) References Cited

U.S. PATENT DOCUMENTS

| | | | | |
|---|---|---|---|---|
| 7,677,749 | B2* | 3/2010 | Chang | G02B 5/0278 362/612 |
| 9,389,367 | B2* | 7/2016 | Yuan | G02B 6/0031 |
| 9,645,303 | B2* | 5/2017 | Tarsa | G02B 6/0078 |
| 2007/0086179 | A1* | 4/2007 | Chen | G02B 6/0021 362/23.1 |
| 2008/0266874 | A1* | 10/2008 | Chang | G02B 3/0043 362/309 |
| 2010/0079980 | A1* | 4/2010 | Sakai | G02B 6/0016 362/97.1 |
| 2011/0286200 | A1* | 11/2011 | Iimura | F21V 7/041 362/84 |
| 2012/0162966 | A1* | 6/2012 | Kim | G02F 1/133606 362/97.1 |
| 2014/0043853 | A1* | 2/2014 | Lavizzari | G02B 6/0021 362/609 |
| 2014/0321153 | A1* | 10/2014 | Chen | G02B 6/0031 362/606 |

FOREIGN PATENT DOCUMENTS

| | | |
|---|---|---|
| KR | 10-2009-0015475 A | 2/2009 |
| KR | 20-2010-0005126 U | 5/2010 |
| KR | 10-2011-0102731 A | 9/2010 |
| KR | 10-2010-0121946 A | 11/2010 |
| KR | 10-2013-0084395 A | 7/2013 |
| WO | WO2008-114581 A1 | 9/2008 |

OTHER PUBLICATIONS

Office Action dated Nov. 25, 2014 in Korean Patent Application No. 10-2013-0152515, 3 pgs.

Office Action dated Jan. 20, 2017 in Chinese Patent Application No. 201480064017.1, 6 pgs.

International Search Report dated Feb. 12, 2015 in PCT/KR2014/011212, 4 pgs.

* cited by examiner

BACKLIGHT UNIT, DOUBLE CONE-SHAPED REFLECTOR, DOUBLE CONE-SHAPED REFLECTOR STRIP, ILLUMINATION APPARATUS, AND METHOD OF MANUFACTURING DOUBLE CONE-SHAPED REFLECTOR

CROSS-REFERENCE TO RELATED APPLICATION(S)

This application is a National Stage entry of International Application No. PCT/KR2014/011212, filed on Nov. 20, 2014, claiming priority to Korean Patent Application Nos. 10-2013-0142928, filed on Nov. 22, 2013, 10-2013-0152515, filed on Dec. 9, 2013, and 10-2013-0152514, filed on Dec. 9, 2013, the contents of which are incorporated herein by reference in their entirety.

TECHNICAL FIELD

The present invention relates to a backlight unit, a double cone-shaped reflector, a double cone-shaped reflector strip, an illumination apparatus, and a method of manufacturing a double cone-shaped reflector, and more particularly, to a backlight unit, a double cone-shaped reflector, a double cone-shaped reflector strip, an illumination apparatus, and a method of manufacturing a double cone-shaped reflector capable of being used for a display application or an illumination application.

BACKGROUND ART

A light emitting diode (LED) indicates a kind of semiconductor device capable of implementing various colors of light by forming a PN diode using a compound semiconductor to configure a light emitting source. The LED has a long lifespan, may be miniaturized and become light, and may be driven at a low voltage. In addition, the LED is robust to impact and vibration, does not require a preheating time and complicated driving, and may be mounted in various shapes on a substrate or a lead frame and be then packaged, such that the LED may be modularized for several applications and be used in a backlight unit, various illumination apparatuses, or the like.

Technical Problem

A direct type light emitting device package that is widely used in a backlight unit may primarily disperse widely light generated in the light emitting device package through a secondary lens in order to decrease a thickness of a unit and uniformly irradiate the light to a light guide plate.

However, in the light emitting device package according to a related art, an entire thickness of a product is increased due to the secondary lens, misalignment of the lens is generated, such that luminance and color deviations result, and the luminance and color deviations deteriorate light characteristics to generate a mura phenomenon or significantly decrease uniformity of the light irradiated to the light guide plate or a display panel, and generate a defect of the product.

Technical Solution

The present invention is to solve several problems including the problems as described above. In an aspect of the present invention, it is to provide a backlight unit, a double cone-shaped reflector, a double cone-shaped reflector strip, an illumination apparatus, and a method of manufacturing a double cone-shaped reflector in which a separate secondary lens is not required, thereby reducing a thickness of a product, and preventing a mura phenomenon of a display apparatus and luminance and color deviations so as to improve light characteristics, and thus a good quality product may be produced. However, this aspect is only an example, and the scope of the present invention is not limited thereto.

According to an exemplary embodiment of the present invention, a backlight unit may include: a flat substrate; a light emitting device mounted on the flat substrate; a light guide plate being disposed on the flat substrate and having an inner wall surface, the inner wall surface defining a through-hole which accommodates the light emitting device; and a reflector being inserted to be installed into the through-hole and having a contacted reflection portion contacted to the light emitting device and a spaced reflection portion spaced from the light emitting device, wherein the contacted reflection portion and the spaced reflection portion are configured to reflect a light generated in the light emitting device to penetrate into the light guide plate through the inner wall surface.

The backlight unit may further include a fixing member connected to an upper portion of the reflector to fix the reflector to the light guide plate.

The fixing member may include a flange part supported by a surrounding part defining the through-hole of the light guide plate.

The light guide plate may include a flange groove part formed at the surrounding part so that the flange part is seated therein.

The reflector may include an inversed conical shape toward the light emitting device.

The flange part may include a male screw part, and the flange groove part may include a female screw part which is engaged with the male screw part.

The spaced reflection portion may be configured to surround the contacted reflection portion.

The contacted reflection portion may be disposed to correspond to the center of a light emitting surface of the light emitting device.

The spaced reflection portion may have a symmetric shape with respect to the contacted reflection portion.

The flat substrate may have the same area as the light guiding plate to be fully overlapped with the light guiding plate.

Each of the light emitting device and the throughout-hole may include a plurality of ones, and the plurality of ones from a lattice structure respectively.

Advantageous Effects

According to some exemplary embodiments of the present invention configured as described above, a thickness of a product may be decreased and light characteristics may be greatly improved, thereby making it possible to produce a high quality product. The scope of the present invention, however, is not limited to the above-mentioned effect.

DETAILED DESCRIPTION

Figure 1:
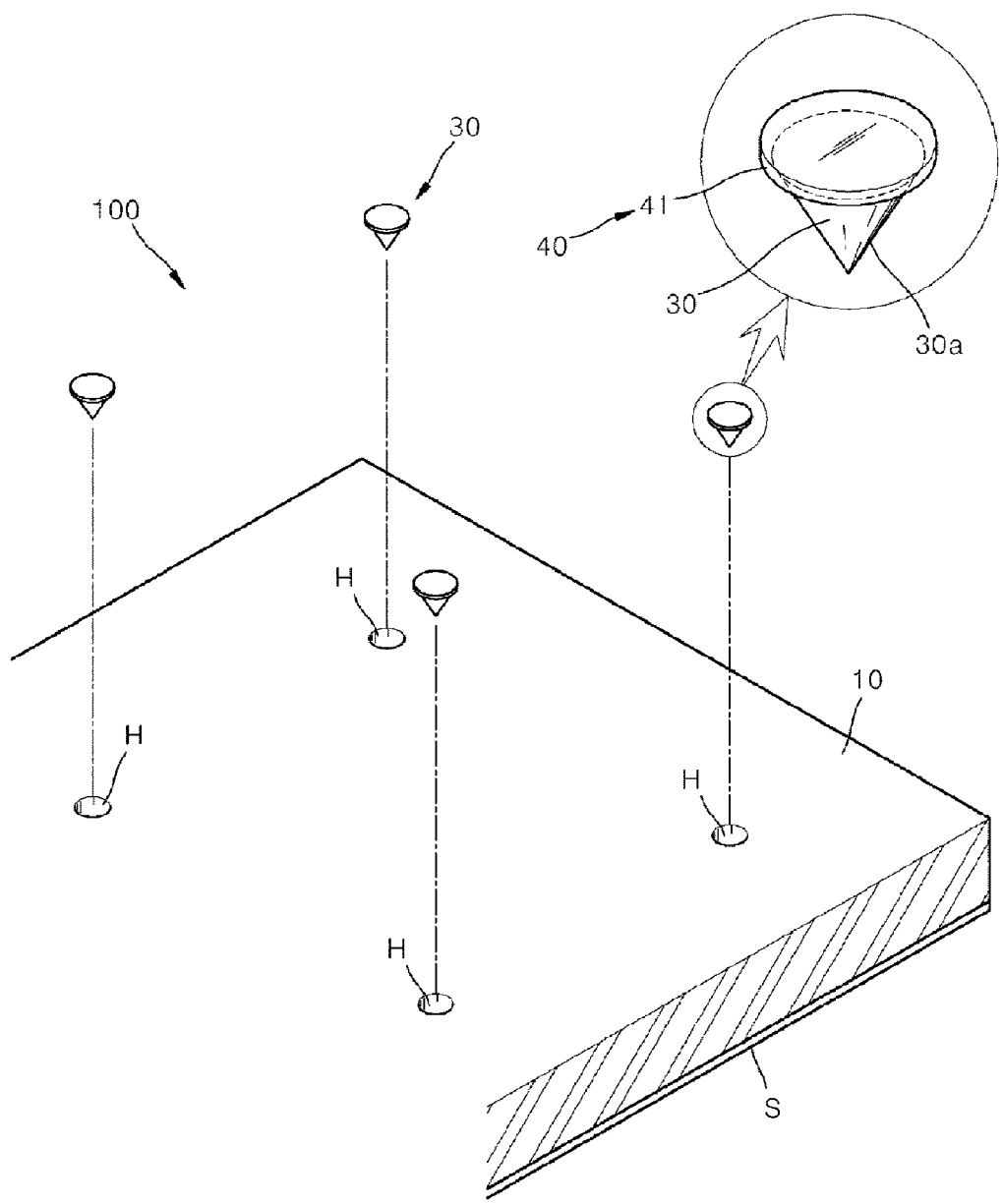
FIG. 1 is an exploded perspective view illustrating a backlight unit according to some exemplary embodiments of the present invention.

Hereinafter, several exemplary embodiments of the present invention will be described in detail with reference to the accompanying drawings.

Exemplary embodiments of the present invention will be provided only in order to further completely describe the present invention to those skilled in the art, the following exemplary embodiments may be modified into several other forms, and the scope of the present invention is not limited to the following exemplary embodiments. Rather, these exemplary embodiments make the present disclosure thorough and complete, and are provided in order to completely transfer the spirit of the present invention to those skilled in the art. In addition, thicknesses or sizes of the respective layers in the drawings have been exaggerated for convenience and clarity of explanation.

Throughout the present disclosure, when it is mentioned that one component such as a film, a region, or a substrate is "positioned on", "connected to", "stacked on", or "coupled to" another component, it may be interpreted that one component is directly "positioned on", "connected to", "stacked on", or "coupled to" another component to contact another component or is "positioned on", "connected to", "stacked on", or "coupled to" another component with the other components interposed therebetween. On the other hand, when it is mentioned that one component is "directly positioned on", "directly connected to", or "directly coupled to" another component, it may be interpreted that one component is "positioned on", "connected to", or "coupled to" another component without the other components interposed therebetween. Like reference numerals denote like elements. As used in the present disclosure, a term "and/or" includes any one of corresponding enumerated items and all combinations of one or more of the corresponding enumerated items.

It is obvious that although terms such as "first", "second", and the like, are used in order to describe various members, components, regions, layers, and/or parts in the present disclosure, these members, components, regions, layers, and/or parts are not limited by these terms. These terms are used only in order to distinguish one member, component, region, layer, or part from another member, component, region, layer, or part. Therefore, a first member, a first component, a first region, a first layer, or a first part to be described below may indicate a second member, a second component, a second region, a second layer, or a second part without departing from the scope of the present invention.

In addition, relative terms such as "on" or "above" and "beneath" or "below" may be used herein in order to describe a relationship between any component and other components as illustrated in the accompanying drawings. It may be understood that the relative terms include other directions of devices in addition to directions illustrated in the accompanying drawings. For example, when devices are overturned in the accompanying drawings, components illustrated as being present on upper surfaces of other components have directions on lower surfaces of other components. Therefore, the term "on" mentioned by way of example may include both of directions of "beneath" and "on" depending on specific directions in the accompanying drawings. When devices are directed toward other directions (rotation by 90 degrees with respect to other directions), relative descriptions used in the present disclosure may be interpreted accordingly.

Terms used in the present disclosure are used in order to describe a specific exemplary embodiment, are not to limit the present invention. As used in the present disclosure, a singular form may include plural forms unless explicitly described otherwise. In addition, terms "comprise" and/or "comprising" used in the present disclosure specify the presence of stated shape, numerals, steps, operations, members, elements, and/or a group thereof, but do not preclude the presence or the addition of one or more other shapes, numerals, steps, operations, members, elements, and/or groups thereof.

Hereinafter, exemplary embodiments of the present invention will be described with reference to the accompanying drawings schematically illustrating ideal exemplary embodiments of the present invention. In the accompanying drawings, for example, modification of illustrated shapes may be expected depending on a manufacturing technology and/or a tolerance. Therefore, an exemplary embodiment of the spirit of the present invention is not to be interpreted as being limited to specific shapes of regions illustrated in the present disclosure, but should include changes of shapes caused in, for example, a manufacturing process.

Figure 2:
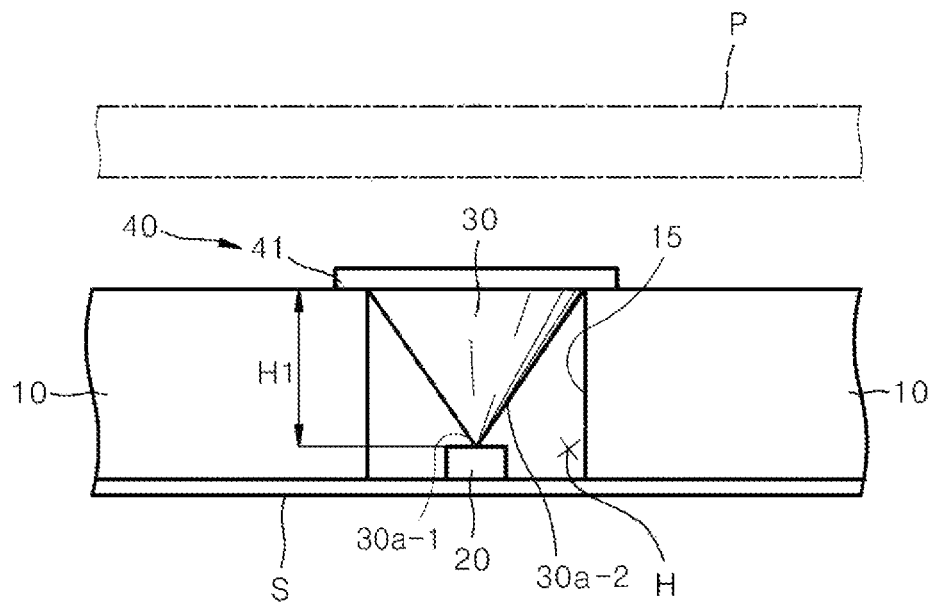
FIG. 2 is a cross-sectional view illustrating the backlight unit of FIG. 1.
Figure 3:
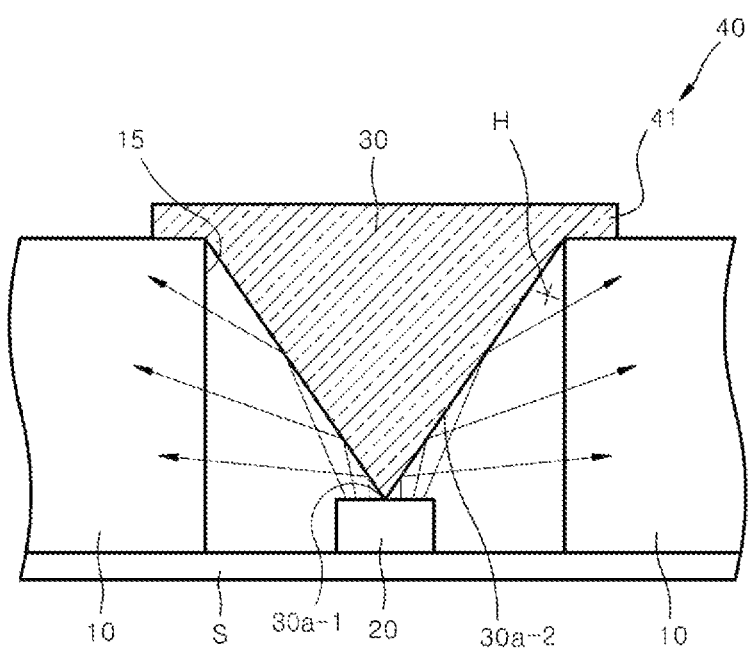
FIG. 3 is an enlarged cross-sectional view illustrating the backlight unit of FIG. 1.

FIG. 1 is an exploded perspective view illustrating a backlight unit 100 according to some exemplary embodiments of the present invention. In addition, FIG. 2 is a cross-sectional view illustrating the backlight unit 100 of FIG. 1, and FIG. 3 is an enlarged cross-sectional view illustrating the backlight unit 100 of FIG. 1.

First, as illustrated in FIG. 1, the backlight unit 100 according to some exemplary embodiments of the present invention may mainly include a light guide plate 10, light emitting devices 20, and inverse cone-shaped reflectors 30.

Here, the light guide plate 10, which has one or more through-holes H formed at predetermined intervals in an upper surface or a lower surface thereof, may be an optical member that may be formed of a translucent material so as to induce light generated in the light emitting device 20. The through-hole H may be defined by an inner wall surface 15. The through-hole H may be prepared as a plurality of through-holes such that the plurality of through-holes forms a lattice. The light guide plate 10 is disposed on a flat substrate S and has the same area as the substrate S to be fully overlapped with the substrate S.

The light guide plate 10 may be installed in a path of the light generated in the light emitting device 20, and transfer the light generated in the light emitting device 20 to a wider area.

The light guide plate 10 may be formed of a material such as a polycarbonate based material, a polysulfone based material, a polyacrylate based material, a polystyrene based material, a polyvinylchloride based material, a polyvinyl alcohol based material, a polynorbornene based material, polyester, or the like. In addition, the light guide plate 10 may be formed of various translucent resin based materials. Further, the light guide plate 10 may be formed by various methods such as a method of forming micro patterns, micro protrusions, a diffusion film, or the like, on a surface thereof, a method of forming micro air bubbles therein.

Here, although not illustrated, various diffusion sheets, a prism sheet, a filter, and the like, may be additionally installed above the light guide plate 10.

In addition, as illustrated in FIG. 2, various display panels P such as a liquid crystal display (LCD) panel, and the like, may be installed above the light guide plate 10.

The backlight unit 100 according to some exemplary embodiments of the present invention described above may be a direct type backlight unit in which the light emitting devices 20 are generally installed at a lower portion of the light guide plate 10, as illustrated in FIG. 1. In addition, the backlight unit may be an edge type backlight unit in which the light emitting devices 20 are generally installed at sides of the light guide plate 10.

In addition, the light emitting device 20 is a kind of light source seated on a substrate S to thereby be electrically connected to a power supply or a controlling unit and installed in the through-hole H of the light guide plate 10.

Here, the substrate S, which has at least one surface installed to face the light guide plate 10, may be formed of a material having appropriate mechanical strength and an insulating property so as to support the light emitting devices 10 or a conductive material.

For example, the substrate S may be a printed circuit board (PCB) in which a plurality of epoxy based resin sheets is formed. Further, the substrate S may be a flexible printed circuit board (FPCB) formed of a flexible material.

In addition, as the substrate S, a synthetic resin substrate formed of a resin, glass epoxy, or the like, may be used or a ceramic substrate may be used in consideration of thermal conductivity. Further, as the substrate S, a metal substrate formed of aluminum, copper, zinc, tin, lead, gold, silver, or the like, that is insulation-processed may be used, and substrates having a plate form or a lead frame form may be used.

Further, the substrate S may be formed of one or more selected from the group consisting of at least an epoxy molding compound (EMC), polyimide (PI), ceramic, graphene, glass synthetic fiber, and combinations thereof in order to improve workability.

Meanwhile, the light emitting device 20 may be formed of a semiconductor, as illustrated in FIGS. 1 to 3. For example, light emitting diodes (LEDs) formed of a nitride semiconductor and emitting blue light, green light, red light, and yellow light, an LED formed of a nitride semiconductor and emitting ultraviolet light, or the like, may be used.

In addition, the light emitting device 20 may be configured by epitaxially growing a nitride semiconductor such as InN, AlN, InGaN, AlGaN, InGaAlN, and the like, on a sapphire substrate or a silicon carbide substrate for growth by a vapor growth method such as a metal organic chemical vapor deposition (MOCVD) method, or the like. In addition, the light emitting device 20 may be formed using semiconductors such as ZnO, ZnS, ZnSe, SiC, GaP, GaAlAs, AlInGaP, and the like, in addition to the nitride semiconductor. As these semiconductors, laminates in which an n-type semiconductor layer, a light emitting layer, and a p-type semiconductor layer are sequentially stacked may be used. As the light emitting layer (active layer), a multilayer semiconductor having a multi-quantum well structure or a single quantum well structure or a multilayer semiconductor having a double hetero structure may be used. In addition, as the light emitting device 20, a light emitting device having any wavelength may be selected according to an application such as a display application, an illumination application, or the like.

Here, as the substrate for growth, an insulating substrate, a conductive substrate, or a semiconductor substrate may be used as needed. For example, the substrate for growth may be formed of sapphire, SiC, Si, $MgAl_2O_4$, MgO, $LiAlO_2$, $LiGaO_2$, or GaN. A GaN substrate, which is a homogeneous substrate, is preferable in order to epitaxially grow a GaN material. However, it is difficult to manufacture the GaN substrate, such that a production cost of the GaN substrate is high.

As a heterogeneous substrate, a sapphire substrate, a silicon carbide (SiC) substrate, or the like, has been mainly used, and the sapphire substrate has been mainly used as compared with the silicon carbide substrate which is expensive. When using the heterogeneous substrate, a defect such as a dislocation, or the like, is increased due to a difference in a lattice constant between a substrate material and a thin film material. In addition, warpage is generated at the time of changing a temperature due to a difference in a coefficient of thermal expansion between the substrate material and the thin film material. The warpage causes a crack of a thin film. This problem may be reduced using a buffer layer between the substrate and a light emitting laminate formed of a GaN based material.

In addition, the substrate for growth may also be completely or partially removed or patterned in a chip manufacturing process in order to improve optical or electrical characteristics of an LED chip before or after growth of an LED structure.

For example, in the case of the sapphire substrate, a laser beam is irradiated to an interface between the sapphire substrate and a semiconductor layer through the sapphire substrate, thereby making it possible to separate the sapphire substrate from the semiconductor layer, and the silicon or silicon carbide substrate may be removed by a method such as a polishing/etching method, or the like.

In addition, another support substrate may be used at the time of removing the substrate for growth. In this case, the support substrate may be bonded to an opposite side to an original growth substrate using a reflecting metal or a reflection structure may be inserted in the middle of a bonding layer, in order to improve light efficiency of an LED chip.

Further, patterning of the substrate for growth forms a rugged part or an inclined surface before or after growth of the LED structure on main surfaces (surfaces or both surfaces) or side surfaces of the substrate, thereby improving light extraction efficiency. Patterns may have sizes that may be selected in a range of 5 nm to 500 μm, may be regular or irregular, and may have any structure for improving the light extraction efficiency. The patterns may have various shapes such as a pillar shape, a mountain shape, a hemispherical shape, a polygonal shape, and the like.

The sapphire substrate, which is a crystal body having Hexa-Rhombo (R3c) symmetry, has lattice constants of 13.001 and 4.758 in c-axis and a-axis directions, and has a C plane, an A plane, an R plane, and the like. In this case, a nitride thin film is relatively easily grown on the C plane and the C plane is stable at a high temperature. Therefore, the C plane is mainly used as a substrate for growing nitride.

In addition, another example of the substrate for growth may be a Si substrate. The Si substrate is more appropriate for increasing a diameter and is relatively cheap, such that a mass production property may be improved.

In addition, the silicon (Si) substrate absorbs light generated in a GaN based semiconductor, such that external quantum efficiency of the light emitting device is reduced. Therefore, the Si substrate is removed, and a support substrate such as a Si substrate, a Ge substrate, a SiAl substrate, a ceramic substrate, a metal substrate, or the like, including a reflection layer is additionally formed and used, if necessary.

When a GaN thin film is grown on a heterogeneous substrate such as the Si substrate, a dislocation density is increased due to discordance between lattice constants of a substrate material and a thin film material, and a crack and warpage may be generated due to a difference between coefficients of thermal expansion of the substrate material and the thin film material. In order to prevent a dislocation and a crack of a light emitting laminate, a buffer layer may be disposed between the substrate for growth and the light emitting laminate. The buffer layer serves to adjust a warpage level of the substrate at the time of growing an active layer, thereby reducing wavelength distribution of a wafer.

In addition, although not illustrated, all of a flip-chip type light emitting device, a horizontal type light emitting device, and a vertical type light emitting device having signal transfer medias such as bumps, pads, solders, or the like, may be used as the light emitting device 20.

Meanwhile, as illustrated in FIGS. 1 to 3, the inverse cone-shaped reflector 30 may be a reflector inserted and installed into the through-hole H of the light guide plate 10 so as to induce the light generated in the light emitting device 20 toward the light guide plate 10 and formed in a cone shape of which an upper portion is flat and a lower portion is sharp.

The inverse cone-shaped reflector 30 may be formed in a generally inversed conical shape so as to induce the light generated and moving upward from the light emitting device 20 in a lateral direction, that is, an omni-direction of 360 degrees, as illustrated in FIGS. 1 to 3.

In addition, as illustrated in FIG. 2, in the case in which a width of the inverse cone-shaped reflector 30 is limited, an angle of a reflection surface 30a (e.g., 30a-2) may be changed depending on a height H1 of the inverse cone-shaped reflector 30. That is, a designer may adjust the height H1 of the inverse cone-shaped reflector 30 to adjust an angle of light reflected toward the light guide plate 10.

For example, when the height H1 of the inverse cone-shaped reflector 30 is high, the angle of the light reflected toward the light guide plate 10 may be increased, and when the height H1 of the inverse cone-shaped reflector 30 is low, the angle of the light reflected toward the light guide plate 10 may be decreased.

Therefore, the height H1 of the inverse cone-shaped reflector 30 is appropriately designed, thereby making it possible to induce a larger amount of light toward the light guide plate 10 in an optimal state.

In addition, the inverse cone-shaped reflector 30 may be formed in various geometric cone shapes such as a triangular pyramid shape, a quadrangular pyramid shape, a polygonal pyramid shape, and an elliptical conical shape, as well as the conical shape.

Further, the inverse cone-shaped reflector 30 generally has a cone shape of which an upper portion is wide and a lower portion is narrow or sharp, and a sharp portion of the inverse cone-shaped reflector 30 may be installed toward the light emitting device 20.

The reflector 30 may have a contacted reflection portion 30a-1 contacted to the light emitting device 20 and a spaced reflection portion 30a-2 spaced from the light emitting device 20. The contacted reflection portion 30a-1 and the spaced reflection portion 30a-2 may reflect light generated in the light emitting device 20 to penetrate into the light guide plate 10 through the inner wall surface 15. The spaced reflection portion 30a-2 may surround the contacted reflection portion 30a-1. The contacted reflection portion 30a-1 may correspond to the center of a light emitting surface of the light emitting device 20. The spaced reflection portion 30a-2 may have a symmetric shape with respect to the contacted reflection portion 30a-1.

In addition, as illustrated in FIG. 3, the inverse cone-shaped reflector 30 may contain any one component selected from the group consisting of at least silver, platinum, gold, mercury, chrome, and a combination thereof, having a high reflectivity so as to reflect the light emitted from the light emitting device 20 in a lateral direction.

Further, the inverse cone-shaped reflector 30 may be formed of one or more selected from the group consisting of at least an epoxy molding compound (EMC), an epoxy resin composition, a silicon resin composition, a modified epoxy resin composition, a modified silicon resin composition, a polyimide resin composition, a modified polyimide resin composition, polyphthalamide (PPA), a polycarbonate resin, polyphenylene sulfide (PPS), a liquid crystal polymer (LCP), an acrylonitrile butadiene styrene (ABS) resin, a phenol resin, an acrylic resin, and a polybutyrene terephthalate (PBT) resin, a Bragg reflection layer, an air gap, a total reflection layer, a metal layer, and a combination thereof.

Further, the inverse cone-shaped reflector 30 may be formed of one or more selected from the group consisting of at least an EMC, an EMC containing a reflecting material, white silicon containing a reflecting material, a photo-imageable solder resist (PSR), and a combination thereof.

Further, in more detail, the inverse cone-shaped reflector 30 may be formed of a resin, for example, an epoxy resin composition, a silicon resin composition, a modified epoxy resin composition such as a silicon-modified epoxy resin, or the like, a modified silicon resin composition such as an epoxy-modified silicon resin, or the like, a polyimide resin composition, a modified polyimide resin composition, PPA, a polycarbonate resin, PPS, an LCP, an ABS resin, a phenol resin, an acrylic resin, a PBT resin, or the like.

Further, these resins may contain a light reflective material such as titanium oxide, silicon dioxide, titanium dioxide, zirconium dioxide, titanium potassium, alumina, aluminum nitride, boron nitride, mullite, chromium, a white based or metal based component, or the like.

An operation process of the backlight unit 100 according to some exemplary embodiments of the present invention will be described with reference to FIG. 3. First, when the light generated in the light emitting device 20 is irradiated toward the inverse cone-shaped reflector 30, the light may be reflected by the reflection surface 30a-2 of the inverse cone-shaped reflector 30 and be then induced in an omni-directional lateral direction of 360 degrees, which is a direction of the light guide plate 10.

Therefore, instead of a conventional bias phenomenon of the light generated in the light emitting device 20 and concentrated in a vertical upward direction, the light generated in the light emitting device 20 is induced in the lateral direction to prevent a mura phenomenon and luminance and color deviations that have been generated in the light guide plate 10, thereby making it possible to improve light characteristics and produce a good quality product.

That is, the light of the light emitting device 20 in a direct upward direction in which a bright part may be formed is completely blocked, and is induced into the lateral direction in which a dark part may be formed, thereby making it possible to induce the light to the display panel P at generally uniform luminous intensity.

That is, the inverse cone-shaped reflector 30 may be manufactured so that an inner portion thereof is filled with an opaque material such as a metal, or the like, having the reflection surface 30a-2 formed on an outer surface thereof.

Figure 4:
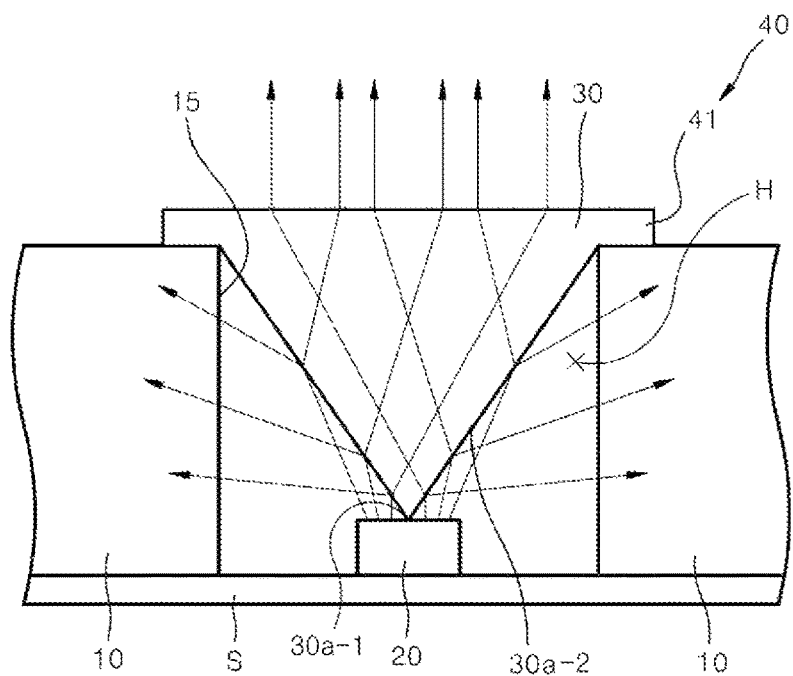
FIG. 4 is an enlarged cross-sectional view illustrating a backlight unit according to some other exemplary embodiments of the present invention.

FIG. 4 is an enlarged cross-sectional view illustrating a backlight unit according to some other exemplary embodiments of the present invention.

In addition, as illustrated in FIG. 4, in the backlight unit according to some other exemplary embodiments of the present invention, the inverse cone-shaped reflector may be formed of a translucent material having the reflection surface 30a-2 formed on an outer surface thereof.

Here, the translucent material may be a material that may reflect some of the light thereon and pass the other of the light therethrough.

The translucent material may be formed of any one selected from the group consisting of an EMC, an epoxy resin composition, a silicon resin composition, a modified epoxy resin composition, a modified silicon resin composition, a polyimide resin composition, a modified polyimide resin composition, PPA, a polycarbonate resin, PPS, an LCP, an ABS resin, a phenol resin, an acrylic resin, a PBT resin, and the like, as well as glass, acryl, or an epoxy resin.

In addition, the inverse cone-shaped reflector 30 is not manufactured by cutting or etching, but may be molded by a separate molding process.

Although not illustrated, a plurality of inverse cone-shaped reflectors 30 may be molded in a strip so that they may be connected to each other and be simultaneously processed en bloc.

An operation process of the inverse cone-shaped reflector 30 formed of the translucent material in the backlight unit according to some exemplary embodiments of the present invention will be described with reference to FIG. 4. First, when the light generated in the light emitting device 20 is irradiated toward the inverse cone-shaped reflector 30, some of the light may be reflected by the reflection surface 30a of the inverse cone-shaped reflector 30 and be then induced in the omni-directional lateral direction of 360 degrees, which is the direction of the light guide plate 10, and the other of the light may pass through the filled inner portion of the inverse cone-shaped reflector 30 and be then emitted in the direct upward direction of the light emitting device 20.

Therefore, the inverse cone-shaped reflector 30 is manufactured so that reflectance and transmittance thereof are precisely adjusted, such that instead of a conventional bias phenomenon or a shortage phenomenon of the light generated in the light emitting device 20 and concentrated in the vertical upward direction, the light generated in the light emitting device 20 is appropriately induced in the lateral direction to prevent a mura phenomenon and luminance and color deviations that have been generated in the light guide plate 10, thereby making it possible to improve light characteristics and produce a good quality product.

That is, the light of the light emitting device 20 in a direct upward direction in which a bright part or a dark part may be formed is partially blocked or is opened, thereby making it possible to induce the light to the display panel P at generally uniform luminous intensity.

Meanwhile, as illustrated in FIGS. 1 to 4, the backlight unit 100 according to some exemplary embodiments of the present invention may further include a fixing member installed between the light guide plate 10 and the inverse cone-shaped reflector 30 and fixing the inverse cone-shaped reflector 30 to the through-hole H of the light guide plate 10.

Here, the fixing member 40 may be a flange part 41 installed at an edge of an upper surface of the inverse cone-shaped reflector 30 and contacting a surrounding part of the through-hole H of the light guide plate 10.

For example, as illustrated in FIGS. 2 to 4, the fixing member 40 is formed at a size equal to or larger than that of the inverse cone-shaped reflector 30, such that the fixing member 40 may be laid over the surrounding part of the through-hole H so as to prevent the inverse cone-shaped reflector 30 from dropping into the through-hole H.

Therefore, as illustrated in FIGS. 2 to 4, the inverse cone-shaped reflector 30 may have a position fixed toward the light emitting device 20 without contacting the light emitting device 20 by the flange part 41.

Here, an adhesive layer may be formed between the flange part 41 and the surrounding part of the through-hole H to firmly adhere the flange part 41 to the light guide plate 10.

In addition, the flange part 41 may be fixed to the light guide plate 10 by various types of fixtures.

Figure 5:
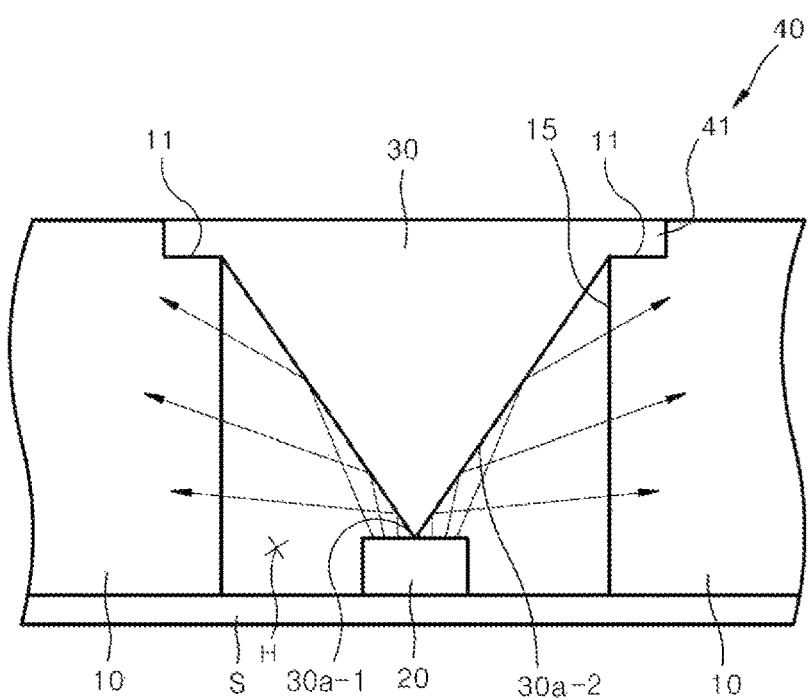
FIG. 5 is an enlarged cross-sectional view illustrating a backlight unit according to some other exemplary embodiments of the present invention.

FIG. 5 is an enlarged cross-sectional view illustrating a backlight unit according to some other exemplary embodiments of the present invention.

As illustrated in FIG. 5, the light guide plate 10 of the backlight unit according to some other exemplary embodiments of the present invention may have a flange groove part 11 formed at the surrounding part of the through-hole H so that the flange part 41 may be seated therein and having a shape corresponding to that of the flange part 41.

Therefore, as illustrated in FIG. 5, the flange part 41 is inserted into the flange groove part 11, such that the inverse cone-shaped reflector 30 does not protrude upward of the light guide plate 10. As a result, an entire thickness of a product may be reduced.

Here, an adhesive layer may be formed between the flange part 41 and the flange groove part 11 to firmly adhere the flange part 41 to the light guide plate 10.

In addition, the flange part 41 may be fixed to the light guide plate 10 by various types of fixtures.

Figure 6:
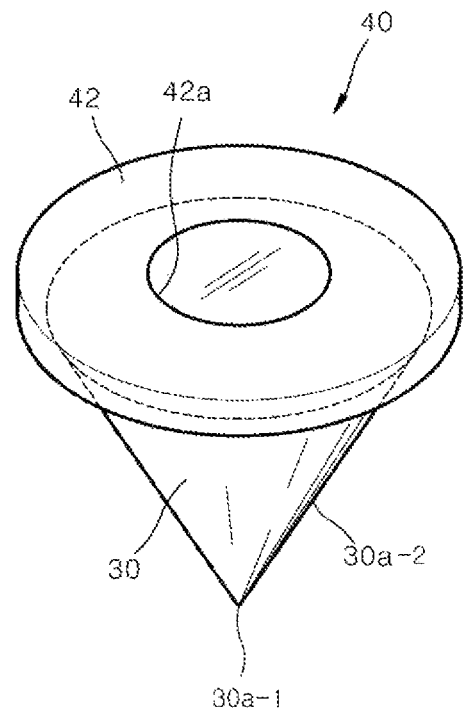
FIG. 6 is a perspective view illustrating a backlight unit according to some other exemplary embodiments of the present invention.
Figure 7:
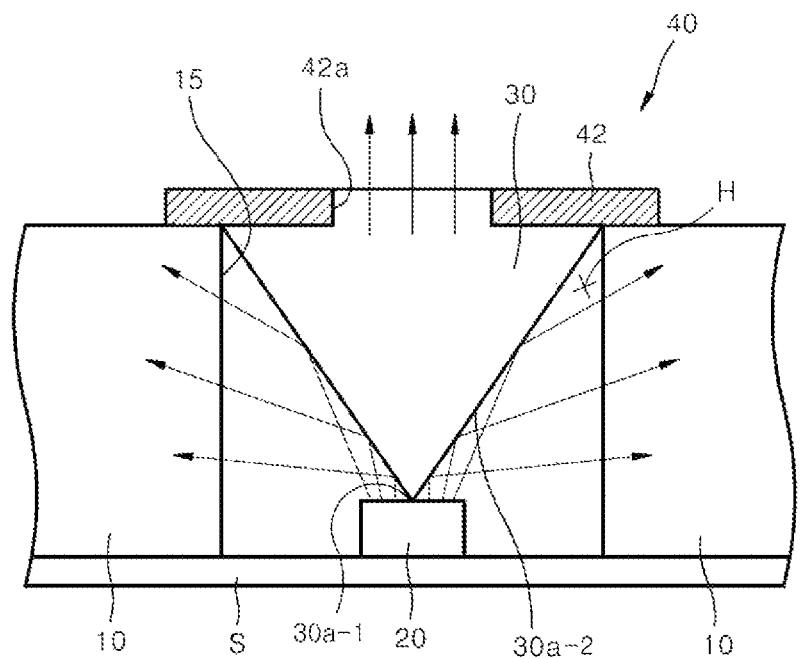
FIG. 7 is an enlarged cross-sectional view illustrating the backlight unit of FIG. 6.

FIG. 6 is a perspective view illustrating a backlight unit according to some other exemplary embodiments of the present invention, and FIG. 7 is an enlarged cross-sectional view illustrating the backlight unit of FIG. 6.

As illustrated in FIGS. 6 and 7, a flange part 42 of the backlight unit according to some other exemplary embodiments of the present invention may have an opening 42a formed in the center thereof, be formed of a metal, and have a disk type ring shape.

Here, the flange part 42 formed of the metal may have excellent abrasion resistance to improve durability and rigidity of a component.

In addition, the flange parts 42 may serve to improve bonding force between the inverse cone-shaped reflectors 30 and the strip through the openings 42a when a plurality of inverse cone-shaped reflectors 30 are molded in the strip so that they may be connected to each other and be simultaneously processed en bloc.

In addition, a size of the opening 42a is optimally designed to emit some of the light passing through the inner portion of the inverse cone-shaped reflector 30 formed of the translucent material upward, thereby making it possible to precisely control formation of the bright part or the dark part.

Figure 8:
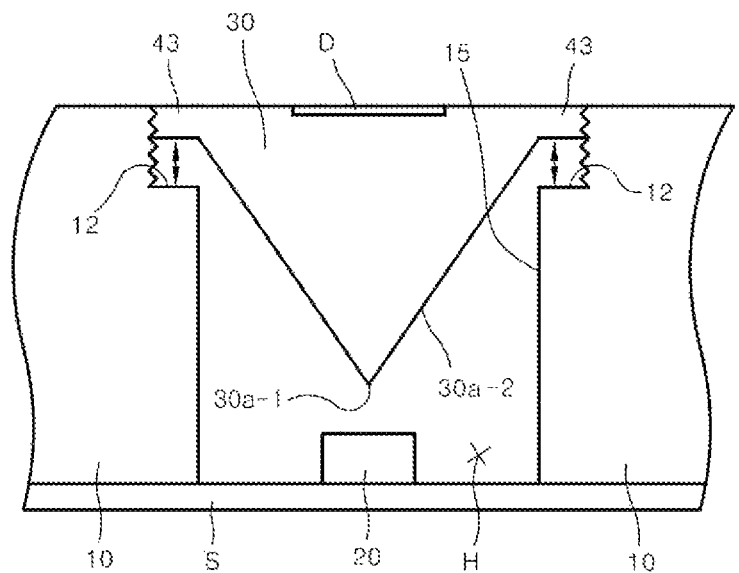
FIG. 8 is an enlarged cross-sectional view illustrating a backlight unit according to some other exemplary embodiments of the present invention.

FIG. 8 is an enlarged cross-sectional view illustrating a backlight unit according to some other exemplary embodiments of the present invention.

As illustrated in FIG. 8, a male screw part may be formed at a flange part 42 of the backlight unit according to some other exemplary embodiments of the present invention, a female screw part corresponding to the male screw part may be formed at the flange groove part 12, and a driver groove D may be formed in an upper surface of the inverse cone-shaped reflector 30.

Therefore, a worker may screw the inverse cone-shaped reflector 30 to the through-hole H of the light guide plate 10 by a screwdriver such as a flat-head screwdriver, a Phillips screwdriver, or the like, using the driver groove D while assembling the inverse cone-shaped reflector 30 to the light guide plate 10.

Here, the worker may adjust a height of the inverse cone-shaped reflector 30 by adjusting the number of rotations of the screwdriver. For example, a sharp end portion of the inverse cone-shaped reflector 30 arrives at and contacts the light emitting device 20, such that the inverse cone-shaped reflector 30 may be more firmly fixed and the height of the inverse cone-shaped reflector 30 may be precisely adjusted.

Figure 9:
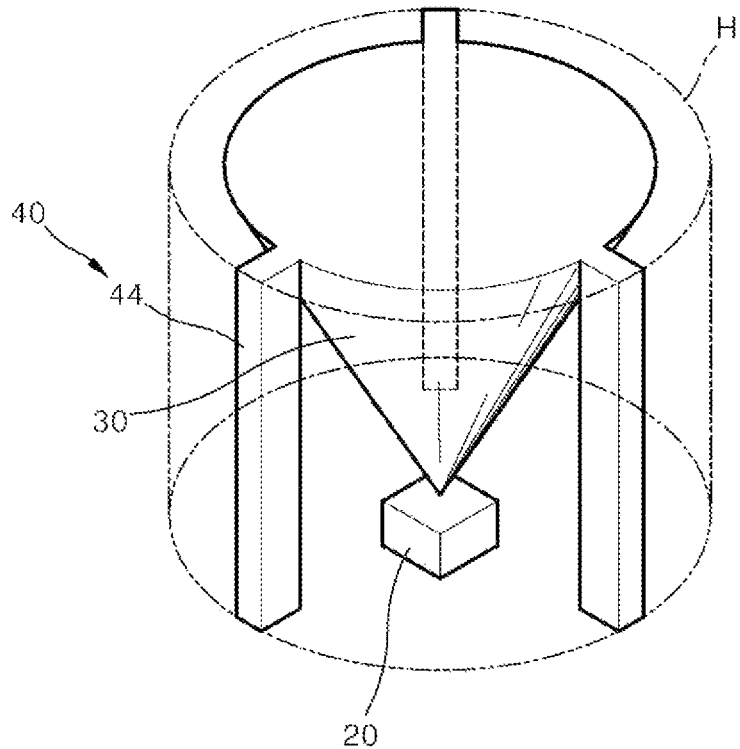
FIG. 9 is a perspective view illustrating a backlight unit according to some other exemplary embodiments of the present invention.
Figure 10:
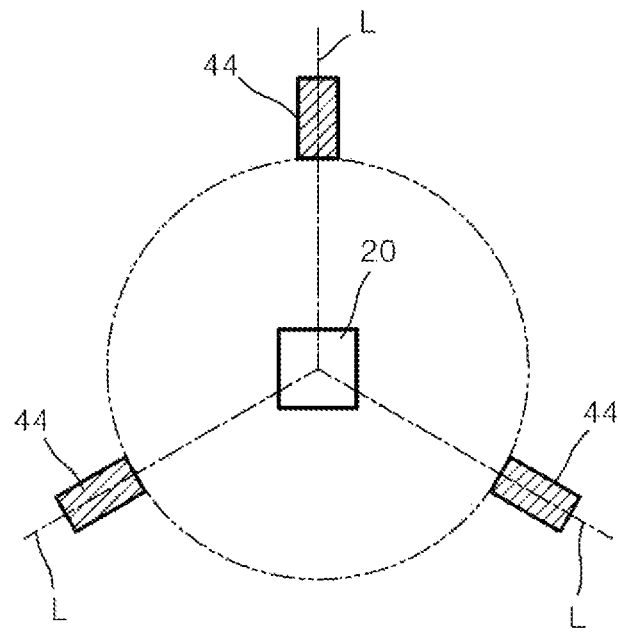
FIG. 10 is a plan view illustrating the backlight unit of FIG. 9.

FIG. 9 is a perspective view illustrating a backlight unit according to some other exemplary embodiments of the present invention, and FIG. 10 is a plan view illustrating the backlight unit of FIG. 9.

As illustrated in FIGS. 9 and 10, a fixing member 40 of the backlight unit according to some other exemplary embodiments of the present invention may be three or more vertical leg parts 44 installed at an upper portion of the inverse cone-shaped reflector 30 and installed along an inner diameter surface of the through-hole H.

Here, the vertical leg parts 44 may be plate-shaped wings disposed at equal angles on radial lines L on the basis of the light emitting device 20 so as to minimize an area in which the light generated in the light emitting device 20 is blocked and having edge portions installed toward the light emitting device 20, as illustrated in FIG. 10.

In addition, outer side surfaces of the vertical leg parts 44 may contact the inner diameter surface of the through-hole H of the light guide plate 10 so that the vertical leg parts 44 may be more firmly fixed to the through-hole H.

Therefore, as illustrated in FIGS. 9 and 10, the inverse cone-shaped reflector 30 may be more firmly and stably fixed to the through-hole H using the vertical leg parts 44.

Figure 11:
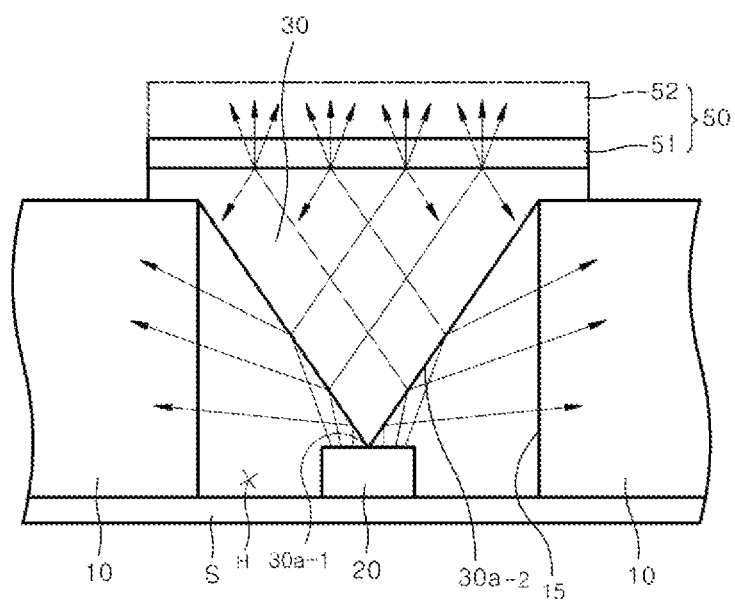
FIG. 11 is an enlarged cross-sectional view illustrating a backlight unit according to some other exemplary embodiments of the present invention.

FIG. 11 is an enlarged cross-sectional view illustrating a backlight unit according to some other exemplary embodiments of the present invention.

As illustrated in FIG. 11, the backlight unit according to some other exemplary embodiments of the present invention may further include an optical system 50 installed on a flat upper surface of the inverse cone-shaped reflector 30.

Here, the optical system 50 may include a partial reflection layer 51 having a predetermined thickness and a total reflection layer 52 formed on the partial reflection layer 51, as illustrated in FIG. 11.

Therefore, the optical system 50 is appropriately disposed to emit some of the light passing through the inner portion of the inverse cone-shaped reflector 30 formed of the translucent material upward, thereby making it possible to precisely control formation of the bright part or the dark part.

The optical system 50 may include any one or more selected from the group consisting of various diffusion layers, optical filter layers, prism sheet layers, scattering layers, refracting layers, metal layers, Bragg reflection layers, air gaps, and a combination thereof, in addition to the partial reflection layer 51 and the total reflection layer 52 described above.

Meanwhile, although not illustrated, a phosphor, a translucent encapsulant, a filler, which is a mixture of the phosphor and the translucent encapsulant, or the like, may be installed in the light emitting device 20.

A combination of the phosphor needs to basically conform with stoichiometry, and the respective elements may be replaced by other elements in the respective groups in a periodic table. For example, Sr may be replaced by Ba, Ca, Mg, or the like, in an alkaline earth (II) group, and Y may be replaced by Tb, Lu, Sc, Gd, or the like, in a lanthanide. In addition, Eu, or the like, which is an activator, may be replaced by Ce, Tb, Pr, Er, Yb, or the like, depending on a desired energy level, and the activator may be used singly or a sub-activator, or the like, may be additionally used in order to change characteristics.

In addition, materials such as a quantum dot, and the like, may be used as a material substituting for the phosphor, and a mixture of the phosphor and the quantum dot may be used or the phosphor or the quantum dot may be singly used in the LED.

The quantum dot may be configured in a structure of a core (3 to 10 nm) of CdSe, InP, or the like, a shell (0.5 to 2 nm) and a core of ZnS, ZnSe, or the like, and a ligand for stabilization of the shell, and may implement various colors depending on a size thereof.

In addition, as a method of applying the phosphor or the quantum dot, at least one of a method of spraying the phosphor or the quantum dot to the LED chip or the light emitting device, a method of covering the LED chip or the light emitting device in a film form, and a method of attaching a sheet form of a film, a ceramic phosphor, or the like, may be used.

The method of spraying the phosphor or the quantum dot generally is a dispensing method, a spray coating method, or the like, and the dispensing method includes a pneumatic method and a mechanical method such as a screw, a linear type, or the like. A dotting amount is controlled through discharging a small amount by a jetting method, thereby making it possible to control a color coordinate. A method of applying the phosphor en bloc onto a wafer level or the substrate of the light emitting device by a spray method may easily control productivity and a thickness.

As the method of directly covering the LED chip or the light emitting device in the film form, an electrophoresis method, a screen printing method, or a method of molding the phosphor may be used. These methods may have a difference depending on whether or not the phosphor is applied onto side surfaces of the LED chip.

In order to control efficiency of a long wavelength light emitting phosphor resorbing light emitted at a short wavelength, of two kinds or more of phosphors having different light emitting wavelengths, the two kinds or more of phosphors having the different light emitting wavelengths may be distinguished from each other, and a DBR (ODR) layer may be included between the respective layers in order to minimize wavelength resorption and interference of the LED chip and the two kinds or more of phosphors.

In order to form a uniform coating film, the phosphor may be manufactured in a film or ceramic form and be then attached onto the LED chip or the light emitting device.

In order to generate a difference in optical efficiency and light distribution characteristics, a light converting material may be positioned in a remote form. In this case, the light converting material is positioned together with translucent polymer, glass, or the like, depending on durability and heat resistance.

Since a technology of applying the phosphor plays the largest role in determining optical characteristics in the light emitting device, various studies on control technologies of a thickness of a phosphor applied layer, uniform dispersion of the phosphor, and the like, have been conducted. The quantum dot may also be positioned in the LED chip or the light emitting device, similar to the phosphor, and be positioned between glass or translucent polymer materials to perform light conversion.

In addition, the translucent encapsulant may be formed of one or more selected from the group consisting of at least an EMC, an epoxy resin composition, a silicon resin composition, a modified epoxy resin composition, a modified silicon resin composition, a polyimide resin composition, a modified polyimide resin composition, PPA, a polycarbonate resin, PPS, an LCP, an ABS resin, a phenol resin, an acrylic resin, and a PBT resin, a Bragg reflection layer, an air gap, a total reflection layer, a metal layer, and a combination thereof.

In addition, the translucent encapsulant may be applied in a paste form to the light emitting device 20, be stacked using a separate stacking process, or be formed by pressing a sheet material.

Meanwhile, although not illustrated, the present invention may include an illumination apparatus including the backlight unit described above. Here, configurations and roles of components of the illumination apparatus according to some exemplary embodiments of the present invention may be the same as those of the corresponding components of the backlight unit according to the present invention described above. Therefore, a detailed description for these components will be omitted.

Figure 12:
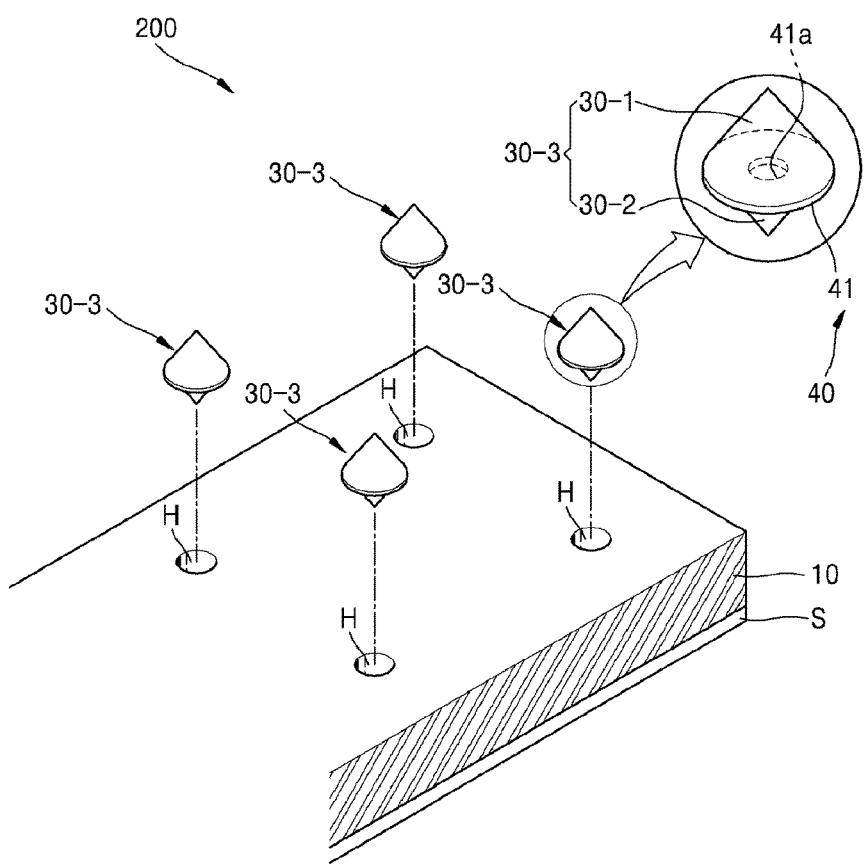
FIG. 12 is an exploded perspective view illustrating a backlight unit according to some other exemplary embodiments of the present invention.

FIG. 12 is an exploded perspective view illustrating a backlight unit 200 according to some other exemplary embodiments of the present invention. In addition, FIG. 13 is a partial side cross-sectional view illustrating the backlight unit 200 of FIG. 12, and FIG. 14 is an enlarged cross-sectional view illustrating the backlight unit 200 of FIG. 12.

Figure 13:
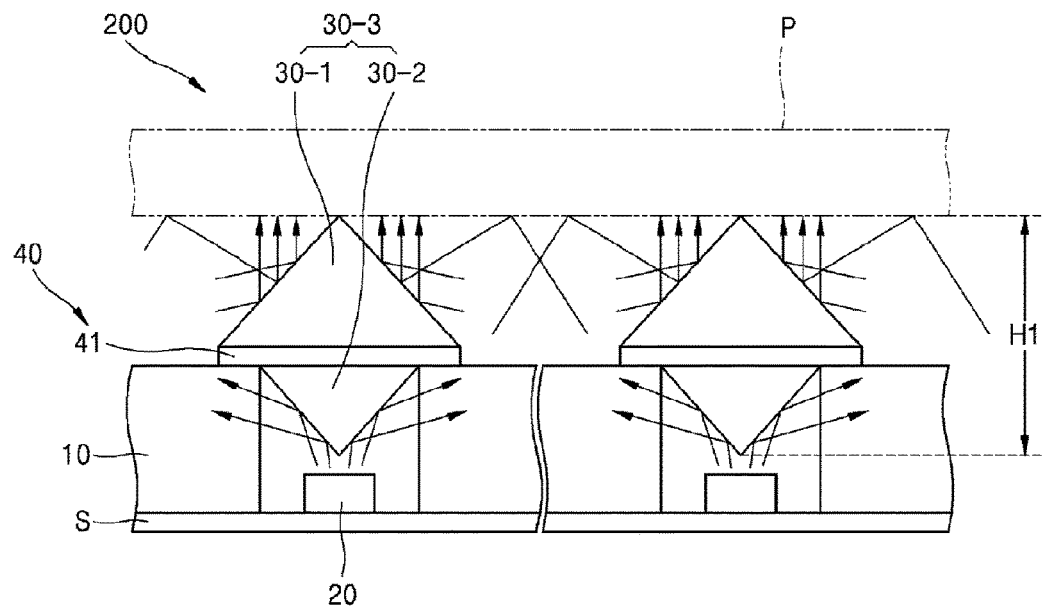
FIG. 13 is a partial side cross-sectional view illustrating the backlight unit of FIG. 12.
Figure 14:
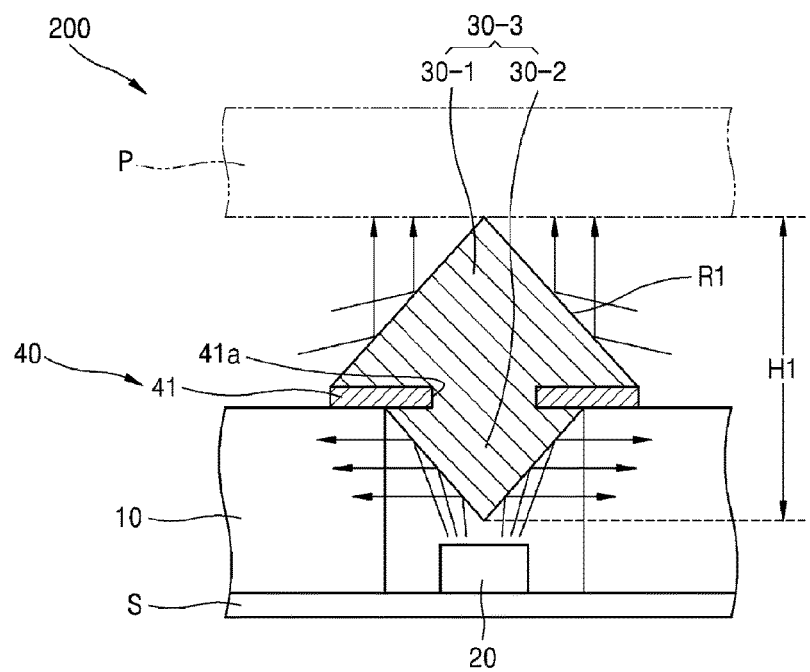
FIG. 14 is an enlarged cross-sectional view illustrating the backlight unit of FIG. 12.

First, as illustrated in FIGS. 12 to 14, the backlight unit 200 according to some other exemplary embodiments of the present invention may include a light guide plate 10, light emitting devices 20, and double cone-shaped reflectors 30-3.

Here, configurations and roles of the light guide plate 10 and the light emitting device 20 may be the same as those of the light guide plate 10 and the light emitting device 20 of the backlight unit 100 according to some exemplary embodiments of the present invention illustrated in FIGS. 1 to 11. Therefore, a detailed description for the light guide plate 10 and the light emitting device 20 will be omitted.

Meanwhile, as illustrated in FIGS. 12 to 14, the double cone-shaped reflector 30-3 may be a reflector generally or partially inserted and installed into the through-hole H of the light guide plate 10 so as to induce the light generated in the light emitting device 20 toward the light guide plate 10 and having a first cone part 30-1 formed at an upper portion thereof and being sharp upward and a second cone part 30-2 formed at a lower portion thereof and being sharp downward.

Here, although the case in which only the second cone part 30-2 of the double cone-shaped reflector 30-3 is partially inserted into the through-hole H has been described by way of example, the first cone part 30-1 may also be generally or partially inserted into the through-hole H.

In addition, as illustrated in FIG. 13, in the case in which a width of the double cone-shaped reflector 30-3 is limited, angles of reflection surfaces of the first cone part 30-1 and the second cone part 30-2 may be changed depending on a height H1 of the double cone-shaped reflector 30-3. That is, a designer may adjust the height H1 of the double cone-shaped reflector 30-3 to adjust an angle of light reflected toward the light guide plate 10.

For example, when the height H1 of the double cone-shaped reflector 30-3 is high, the angle of the light reflected toward the light guide plate 10 may be increased, and when the height H1 of the double cone-shaped reflector 30-3 is low, the angle of the light reflected toward the light guide plate 10 may be decreased.

Therefore, the height H1 of the double cone-shaped reflector 30-3 is appropriately designed, thereby making it possible to induce a larger amount of light toward the light guide plate 10 in an optimal state.

In addition, the first cone part 30-1 and the second cone part 30-2 of the double cone-shaped reflector 30-3 may be formed in various geometric cone shapes such as a triangular pyramid shape, a quadrangular pyramid shape, a polygonal pyramid shape, and an elliptical conical shape, as well as the conical shape.

Further, the double cone-shaped reflector 30-3 generally has a double cone shape of which an upper portion and a lower portion are narrow and sharp and an intermediate portion is wide, and sharp portions of the upper and lower portions may be installed to face the display panel P and the light emitting device 20, respectively.

Further, as illustrated in FIG. 14, the double cone-shaped reflector 30-3 may contain any one metal component selected from the group consisting of at least silver, platinum, gold, mercury, chrome, and a combination thereof, having a high reflectivity so as to primarily reflect the light emitted from the light emitting device 20 toward the light guide plate 10 and secondarily reflect the light emitted from the light emitting device 20 toward the display panel P.

Further, the double cone-shaped reflector 30-3 may be formed of one or more selected from the group consisting of at least an EMC, an epoxy resin composition, a silicon resin composition, a modified epoxy resin composition, a modified silicon resin composition, a polyimide resin composition, a modified polyimide resin composition, PPA, a polycarbonate resin, PPS, an LCP, an ABS resin, a phenol resin, an acrylic resin, and a PBT resin, a Bragg reflection layer, an air gap, a total reflection layer, a metal layer, and a combination thereof.

Further, the double cone-shaped reflector 30-3 may be formed of one or more selected from the group consisting of at least an EMC, an EMC containing a reflecting material, white silicon containing a reflecting material, a PSR, and a combination thereof.

Further, in more detail, the double cone-shaped reflector 30-3 may be formed of a resin, for example, an epoxy resin composition, a silicon resin composition, a modified epoxy resin composition such as a silicon-modified epoxy resin, or the like, a modified silicon resin composition such as an epoxy-modified silicon resin, or the like, a polyimide resin composition, a modified polyimide resin composition, PPA, a polycarbonate resin, PPS, an LCP, an ABS resin, a phenol resin, an acrylic resin, a PBT resin, or the like.

Further, these resins may contain a light reflective material such as titanium oxide, silicon dioxide, titanium dioxide, zirconium dioxide, titanium potassium, alumina, aluminum nitride, boron nitride, mullite, chromium, a white based or metal based component, or the like.

An operation process of the backlight unit 200 according to some other exemplary embodiments of the present invention will be described with reference to FIG. 14. First, when the light generated in the light emitting device 20 is irradiated to the first cone part 30-1 of the double cone-shaped reflector 30-3, the light may be reflected by the reflection surface of the first cone part 30-1 and be then induced in all directions, which are a direction of the light guide plate 10, that is, a lateral direction of 360 degrees.

Then, when some of the light irradiated toward the display panel P through the light guide plate 10 is irradiated to the second cone part 30-2 of the double cone-shaped reflector 30-3, the light may be reflected by the reflection surface of the second cone part 30-2 and be then induced in an upward direction of the second cone part 30-2.

Therefore, instead of a conventional bias phenomenon of the light generated in the light emitting device 20 and concentrated in a vertical upward direction, the light generated in the light emitting device 20 may be uniformly induced in the lateral direction, and a dark part that may be generated in the vertical upward direction of the double cone-shaped reflector 30-3 may be prevented to prevent a mura phenomenon of the light and luminance and color deviations, to improve light characteristics, and produce a good quality product.

That is, the light in a direct upward direction of the light emitting device 20 in which a bright part may be formed may be blocked and be induced in the lateral direction in which a dark part may be formed. In this process, some of the light may be induced in the vertical upward direction of the double cone-shaped reflector 30-3 in which the dark part may be excessively formed, such that the light may be induced to the display panel P at generally uniform luminous intensity.

That is, the double cone-shaped reflector 30-3 may be manufactured so that an inner portion thereof is filled with an opaque material such as a metal, or the like, having the reflection surface formed on an outer surface thereof.

Figure 15:
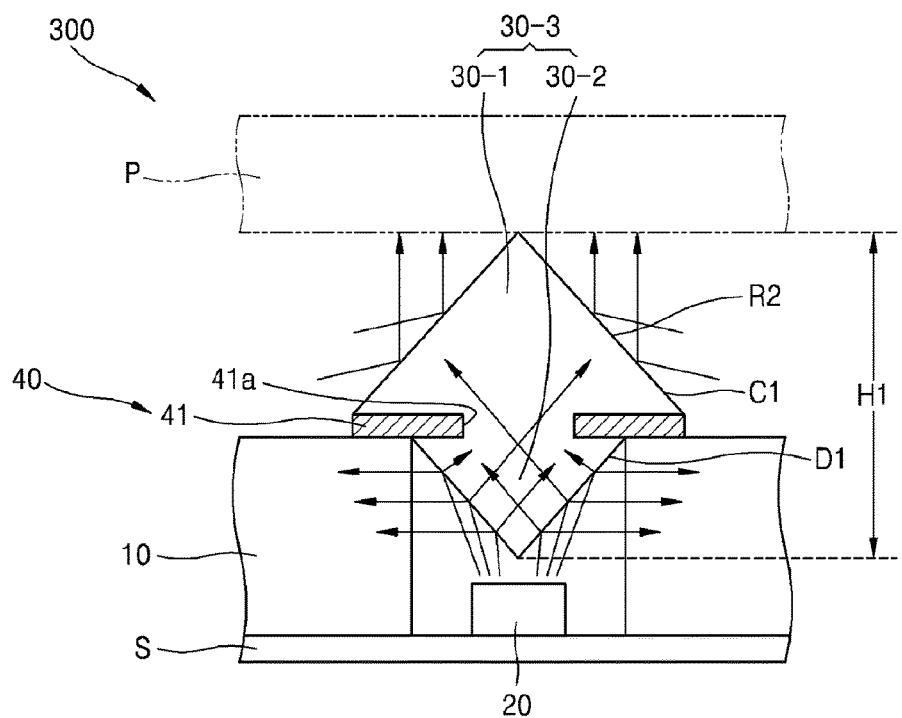
FIG. 15 is an enlarged cross-sectional view illustrating a backlight unit according to some other exemplary embodiments of the present invention.

FIG. 15 is an enlarged cross-sectional view illustrating a backlight unit 300 according to some other exemplary embodiments of the present invention.

In addition, as illustrated in FIG. 15, in the backlight unit 300 according to some other exemplary embodiments of the present invention, the double cone-shaped reflector 30-3 may be formed of a translucent material having a partial reflection surface formed on an outer surface thereof. In addition, the double cone-shaped reflector 30-3 may be a molding structure of which an inner portion is filled.

Here, the translucent material may be a material that may reflect some of the light thereon and pass the other of the light therethrough.

The translucent material may be formed of any one selected from the group consisting of an EMC, an epoxy resin composition, a silicon resin composition, a modified epoxy resin composition, a modified silicon resin composition, a polyimide resin composition, a modified polyimide resin composition, PPA, a polycarbonate resin, PPS, an LCP, an ABS resin, a phenol resin, an acrylic resin, a PBT resin, and the like, as well as glass, acryl, or an epoxy resin.

In addition, the double cone-shaped reflector 30-3 may be manufactured by cutting or etching or may be molded by a separate molding process.

An operation process of the double cone-shaped reflector 30-3 formed of the translucent material in the backlight unit according to some other exemplary embodiments of the present invention will be described with reference to FIG. 15. First, when the light generated in the light emitting device 20 is irradiated to the first cone part 30-1 of the double cone-shaped reflector 30-3, some of the light may be reflected by the reflection surface of the first cone part 30-1 and be then induced in all directions, which are a direction of the light guide plate 10, that is, a lateral direction of 360 degrees, and the other of the light may pass through the filled inner portion of the double cone-shaped reflector 30-3 and be then emitted toward the second cone part 30-2.

Then, when some of the light irradiated toward the display panel P through the light guide plate 10 is irradiated to the second cone part 30-2 of the double cone-shaped reflector 30-3, the light may be reflected by the reflection surface of the second cone part 30-2 and be then induced in an upward direction of the second cone part 30-2.

Therefore, instead of a conventional bias phenomenon of the light generated in the light emitting device 20 and concentrated in a vertical upward direction, some of the light generated in the light emitting device 20 may be uniformly induced in the lateral direction, the other of the light may be induced in the vertical upward direction through the second cone part 30-2 to prevent a dark part that may be generated in the vertical upward direction of the double cone-shaped reflector 30-3, thereby making it possible to prevent a mura phenomenon of the light and luminance and color deviations, to improve light characteristics, and produce a good quality product.

That is, the light in a direct upward direction of the light emitting device 20 in which a bright part may be formed may be blocked and be induced in the lateral direction in which a dark part may be formed. In this process, some of the light may be induced in the vertical upward direction of the double cone-shaped reflector 30-3 in which the dark part may be excessively formed, such that the light may be induced to the display panel P at generally uniform luminous intensity.

In addition, as illustrated in FIGS. 12 to 15, the backlight units 200 and 300 according to some other exemplary embodiments of the present invention may further include a fixing member 40 installed between the first cone part 30-1 and the second cone part 30-2 of the double cone-shaped reflector 30-3 and fixing the double cone-shaped reflector 30-3 to the through-hole H of the light guide plate 10.

Here, the fixing member 40 may be a flange part 41 installed at an edge of the double cone-shaped reflector 30-3 and contacting a surrounding part of the through-hole H of the light guide plate 10.

For example, as illustrated in FIGS. 12 to 15, the fixing member 40 is formed at a size equal to that of a lower surface of the first cone part 30-1 of the double cone-shaped reflector 30-3 and equal to or larger than that of an upper surface of the second cone part 30-2 of the double cone-shaped reflector 30-3, such that the fixing member 40 may be laid over the surrounding part of the through-hole H so as to prevent the double cone-shaped reflector 30-3 from dropping into the through-hole H.

Therefore, as illustrated in FIGS. 12 to 15, the double cone-shaped reflector 30-3 may have a position fixed toward the light emitting device 20 without contacting the light emitting device 20 by the flange part 41. In addition, the second cone part 30-2 of the double cone-shaped reflector 30-3 may support the display panel P.

Here, the double cone-shaped reflector 30-3 may be simply laid over the surrounding part of the through-hole H. In addition, an adhesive layer may be formed between the flange part 41 and the surrounding part of the through-hole H, such that the flange part 41 may be firmly adhered to the light guide plate 10.

In addition, the flange part 41 may be fixed to the light guide plate 10 by various types of fixtures.

Figure 16:
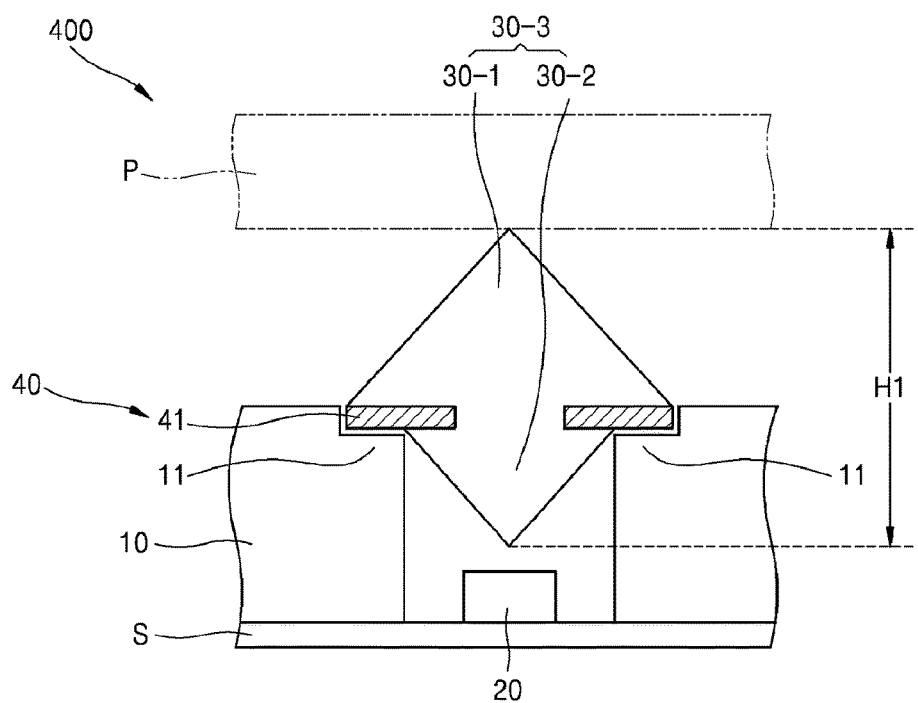
FIG. 16 is an enlarged cross-sectional view illustrating a backlight unit according to some other exemplary embodiments of the present invention.

As illustrated in FIG. 16, a light guide plate 10 of a backlight unit 400 according to some other exemplary embodiments of the present invention may have a flange groove part 11 formed at the surrounding part of the through-hole H so that the flange part 41 may be seated therein and having a shape corresponding to that of the flange part 41.

Therefore, as illustrated in FIG. 16, the flange part 41 is inserted into the flange groove part 11, such that the double cone-shaped reflector 30-3 does not protrude upward of the light guide plate 10. As a result, an entire thickness of a product may be reduced.

Here, an adhesive layer may be formed between the flange part 41 and the flange groove part 11 to firmly adhere the flange part 41 to the light guide plate 10.

In addition, the flange part 41 may be fixed to the light guide plate 10 by various types of fixtures.

Further, as illustrated in FIGS. 12 to 16, in the double cone-shaped reflector 30-3, the lower surface of the first cone part 30-1 may be larger than the upper surface of the second cone part 30-2, and the flange part 41 may have an opening 41a formed in the center thereof and at least larger than the upper surface of the second cone part 30-2 so that a molding material may pass therethrough, be formed of a metal, and have a disk type ring shape.

The flange part 41 formed of the metal may have excellent abrasion resistance to improve durability and rigidity of a component.

In addition, the flange parts 41 may serve to improve bonding force between components by allowing the molding material to be hardened while passing through the openings 41a thereof when a plurality of double cone-shaped reflectors 30-3 are molded in a lead frame strip so that they may be connected to each other and be simultaneously processed en bloc.

In addition, a size of the opening 41a is optimally designed to emit some of the light passing through the inner portion of the double cone-shaped reflector 30-3 formed of the translucent material upward, thereby making it possible to precisely control formation of the bright part or the dark part.

FIGS. 17 to 20 are side cross-sectional views illustrating various examples of a first cone part 30-1 and a second cone part 30-2 of the backlight unit 100 of FIG. 12.

As illustrated in FIGS. 15 to 20, the first cone part 30-1 may include at least any one of a linear inclined surface C1 (see FIG. 15) inclined at a predetermined angle, a convex inclined surface C2 (see FIG. 17) convex upward, a concave inclined surface C3 (see FIG. 18) concave upward, and a combination thereof, and the second cone part 30-2 may include at least any one of a linear inclined surface D1 (see FIG. 15) inclined at a predetermined angle, a convex inclined surface D2 (see FIG. 17) convex downward, a concave inclined surface D3 (see FIG. 18) concave downward, and a combination thereof.

Figure 17:
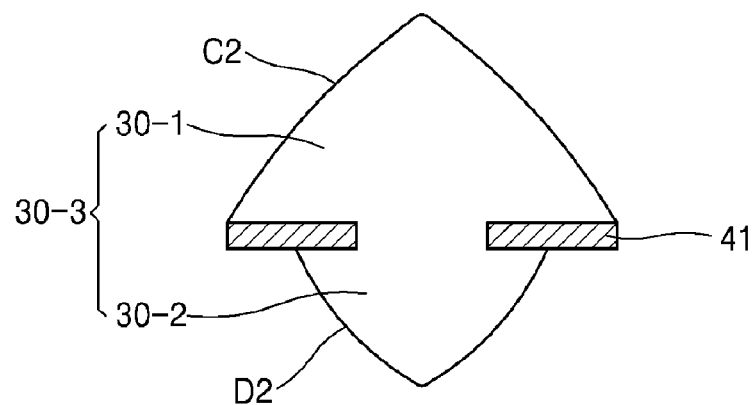
FIGS. 17 to 20 are side cross-sectional views illustrating various examples of a first cone part and a second cone part of the backlight unit of FIG. 12.

In more detail, for example, as illustrated in FIG. 17, the first cone part 30-1 may have the convex inclined surface C2 convex upward, and the second cone part 30-2 may have the convex inclined surface D2 convex downward.

Figure 18:
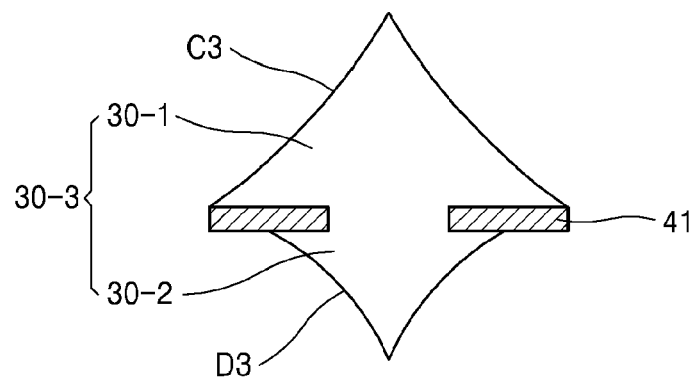

In addition, as illustrated in FIG. 18, the first cone part 30-1 may have the concave inclined surface C3 concave upward, and the second cone part 30-2 may have the concave inclined surface D3 concave downward.

Figure 19:
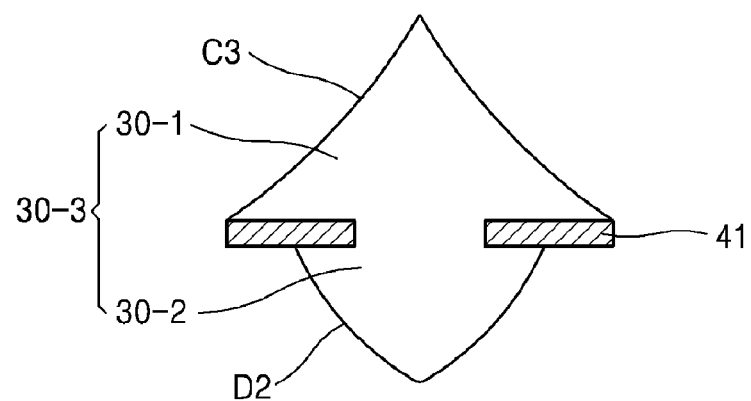

Further, as illustrated in FIG. 19, the first cone part 30-1 may have the concave inclined surface C3 concave upward, and the second cone part 30-2 may have the convex inclined surface D2 convex downward.

Figure 20:
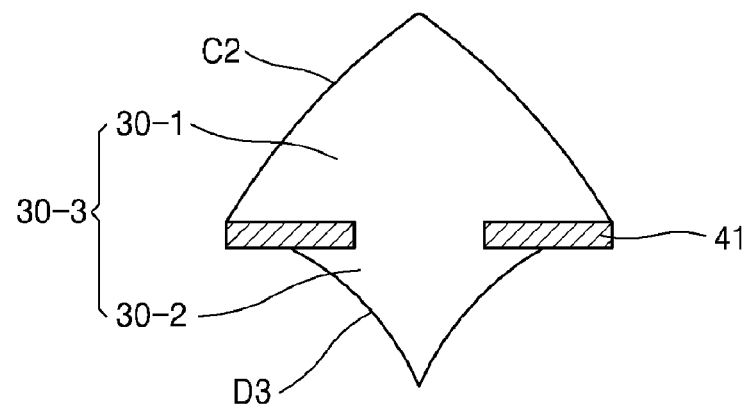

Further, as illustrated in FIG. 20, the first cone part 30-1 may have the convex inclined surface C2 convex upward, and the second cone part 30-2 may have the concave inclined surface D3 concave downward.

In addition, the first cone part 30-1 and the second cone part 30-2 may have inclined surfaces formed in various geometric shapes, and cross sections of the first cone part 30-1 and the second cone part 30-2 may be formed in very various shapes such as an elliptical shape, a triangular shape, a quadrangular shape, various geometric shapes, and the like.

Further, the double cone-shaped reflector 30-3 may be formed of an opaque material having a reflection surface R1 (see FIG. 14) formed on an outer surface thereof or be formed of a translucent material having a partial reflection surface R2 (see FIG. 15) formed on an outer surface thereof.

Figure 21:
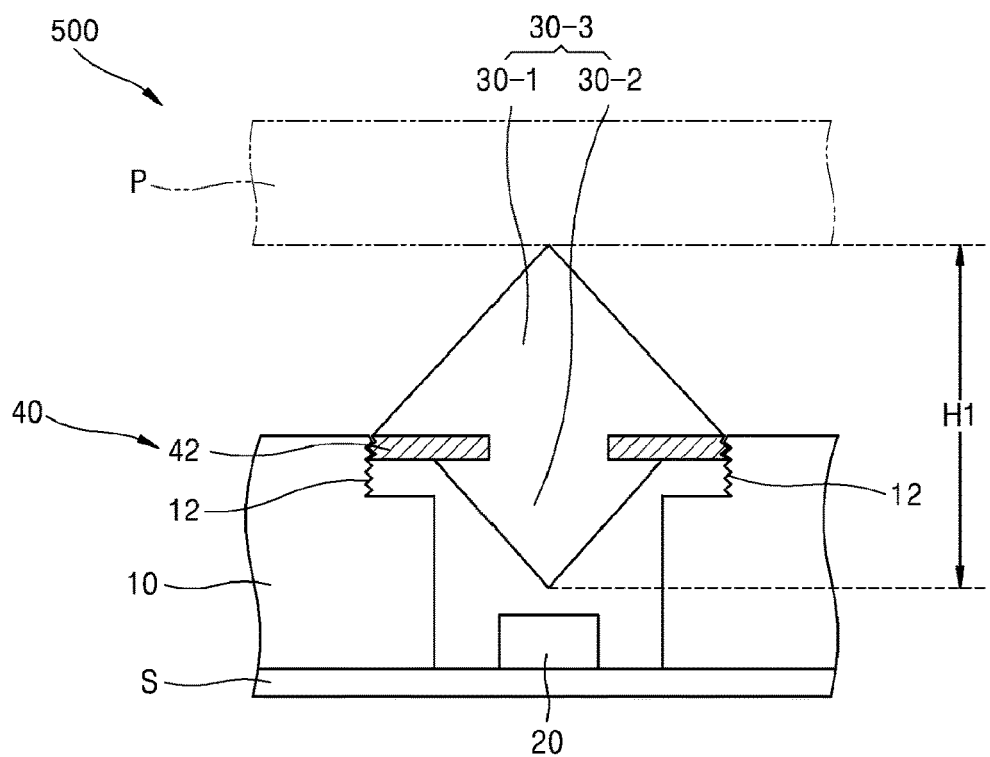
FIG. 21 is an enlarged cross-sectional view illustrating a backlight unit according to some other exemplary embodiments of the present invention.

FIG. 21 is an enlarged cross-sectional view illustrating a backlight unit 500 according to some other exemplary embodiments of the present invention.

As illustrated in FIG. 21, a male screw part may be formed at a flange part 42 of the backlight unit 500 according to some other exemplary embodiments of the present invention, and a female screw part corresponding to the male screw part may be formed at a flange groove part 12.

Therefore, a worker may screw the double cone-shaped reflector 30-3 to the through-hole H of the light guide plate 10 while assembling the double cone-shaped reflector 30-3 to the light guide plate 10.

Here, the worker may adjust a height of the double cone-shaped reflector 30-3 by adjusting the number of rotations of the double cone-shaped reflector 30-3. For example, a horizontal state of the display panel P may be adjusted by precisely adjusting the first cone part 30-1 of the double cone-shaped reflector 30-3, and more firmly fixing and precise height adjustment of the double cone-shaped reflector 30-3 may be performed by allowing a sharp end portion of the second cone part 30-2 to arrive at and contact the light emitting device 20.

Figure 22:
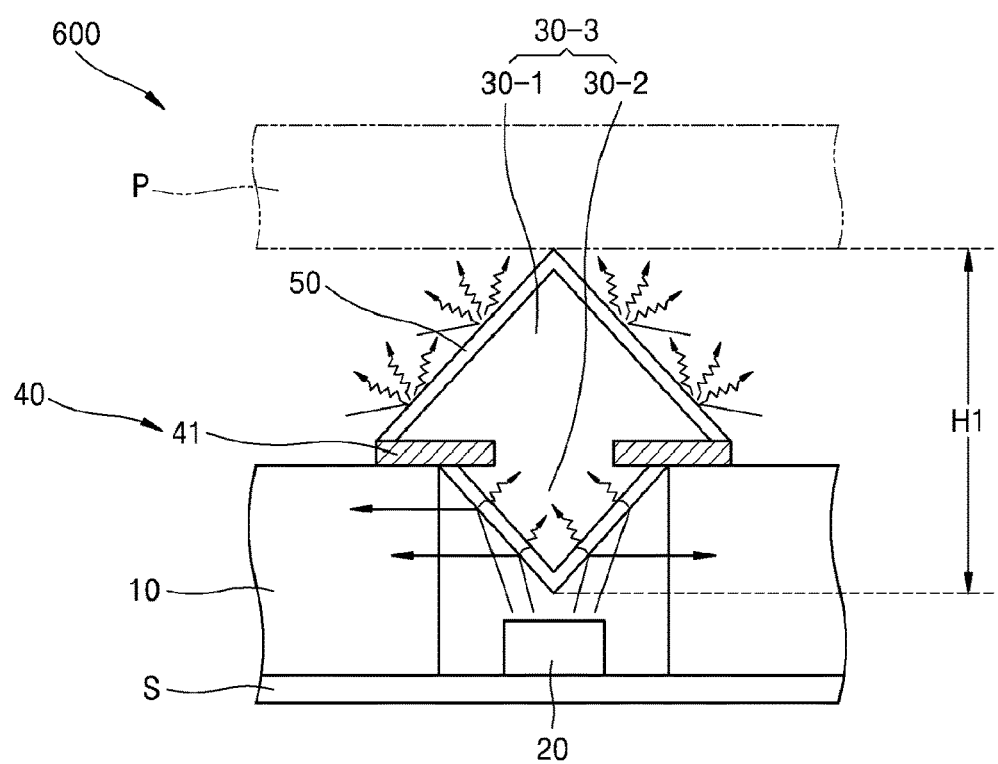
FIG. 22 is an enlarged cross-sectional view illustrating a backlight unit according to some other exemplary embodiments of the present invention.

As illustrated in FIG. 22, a backlight unit 600 according to some other exemplary embodiments of the present invention may further include an optical system 50 installed on a surface of the double cone-shaped reflector 30-3.

Here, the optical system 50 may be a partial reflection layer or a total reflection layer having a predetermined thickness or a combination thereof, as illustrated FIG. 22.

Therefore, the optical system 50 is appropriately disposed to emit some of the light passing through the inner portion of the double cone-shaped reflector 30-3 formed of the translucent material upward. In this case, the emitted light is scattered or refracted, thereby making it possible to precisely control formation of the bright part or the dark part.

In addition, the optical system 50 may include any one or more selected from the group consisting of various diffusion layers, optical filter layers, prism sheet layers, scattering layers, refracting layers, metal layers, Bragg reflection layers, air gaps, and a combination thereof, in addition to the partial reflection layer and the total reflection layer described above.

Figure 23:
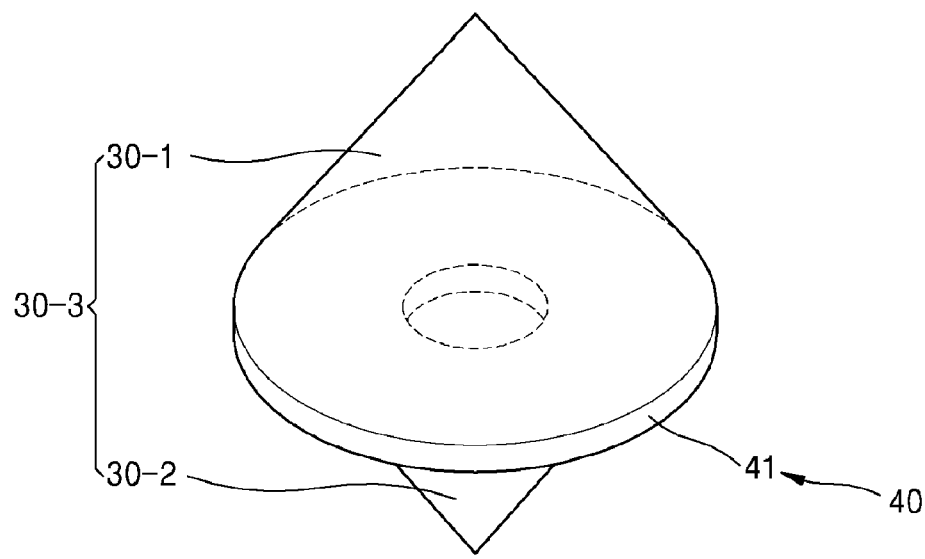
FIG. 23 is an enlarged perspective view illustrating a double cone-shaped reflector of FIG. 12.
Figure 24:
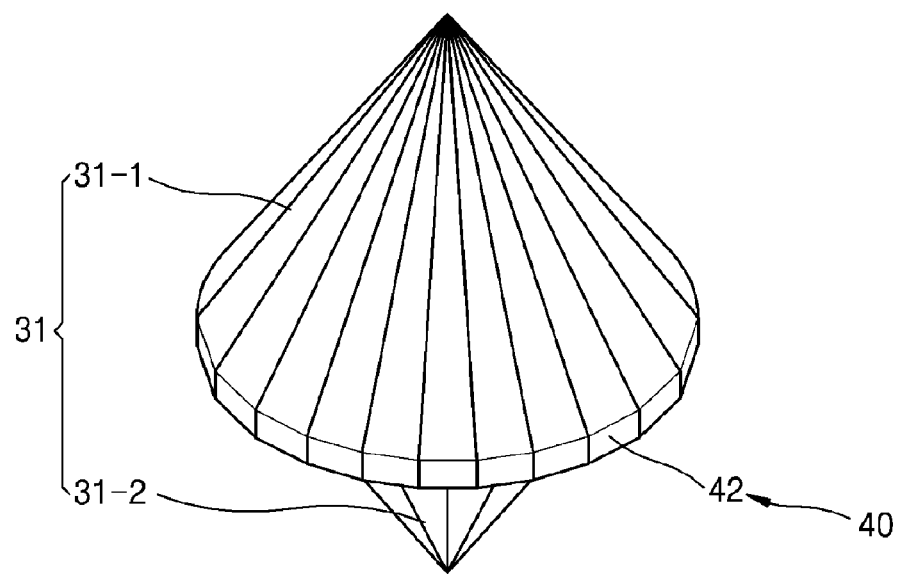
FIG. 24 is an enlarged perspective view illustrating a double cone-shaped reflector according to another exemplary embodiment of FIG. 23.

FIG. 23 is an enlarged perspective view illustrating a double cone-shaped reflector 30-3 of FIG. 12, and FIG. 24 is an enlarged perspective view illustrating a double cone-shaped reflector 31 according to another exemplary embodiment of FIG. 23.

First, as illustrated in FIG. 23, the double cone-shaped reflector 30-3 according to some exemplary embodiments of the present invention may mainly include a first cone part 30-1 and a second cone part 30-2.

Here, the first cone part 30-1 may be a reflector sharp upward, and the second cone part 30-2 may be a reflector inserted and installed into the through-hole H of the light guide plate 10 so as to induce the light generated in the light emitting device 20 toward the light guide plate 10, installed below the first cone part 30-1, and sharp downward.

In addition, the first cone part 30-1 and the second cone part 30-2 may be molding structures formed integrally with each other in a form in which inner portions thereof are filled.

Here, although the case in which only the second cone part 30-2 of the double cone-shaped reflector 30-3 is partially inserted into the through-hole H has been described by way of example, the first cone part 30-1 may also be generally or partially inserted into the through-hole H.

In addition, as illustrated in FIG. 23, the first cone part 30-1 and the second cone part 30-2 of the double cone-shaped reflector 30-3 may be formed in a conical shape.

In addition, as illustrated in FIG. 24, the first cone part 31-1 and the second cone part 31-2 of the double cone-shaped reflector 31-3 may be formed in a polygonal pyramid shape.

In addition, the double cone-shaped reflector 31-3 may be formed in various geometric cone shapes such as a double triangular pyramid shape, a double quadrangular pyramid shape, a double polygonal pyramid shape, and a double elliptical conical shape.

Further, the double cone-shaped reflector 30-3 generally has a double cone shape of which an upper portion and a lower portion are narrow and sharp and an intermediate portion is wide, and sharp portions of the upper and lower portions may be installed to face the display panel P and the light emitting device 20, respectively.

Figure 25:
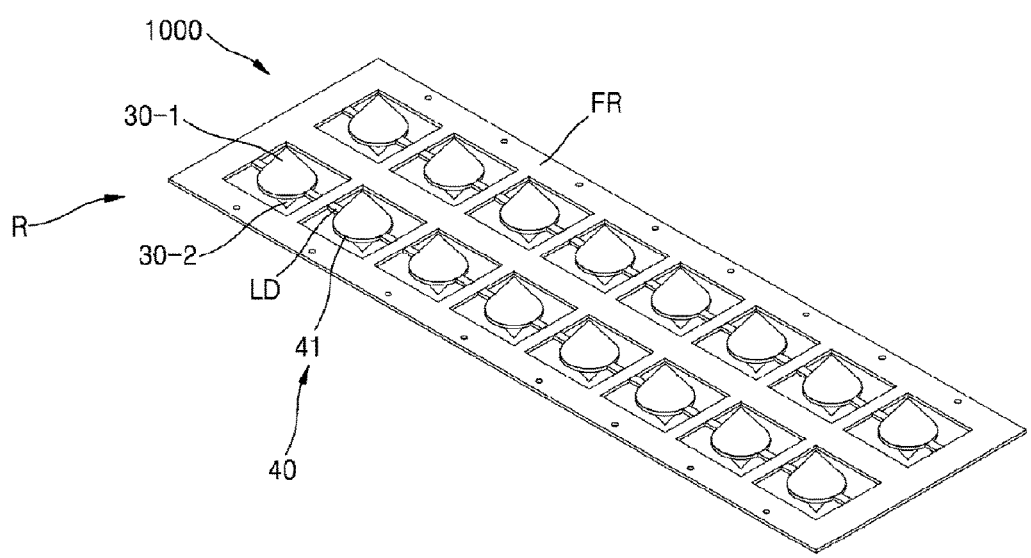
FIG. 25 is a perspective view illustrating a double cone-shaped reflector strip according to some exemplary embodiments of the present invention.
Figure 26:
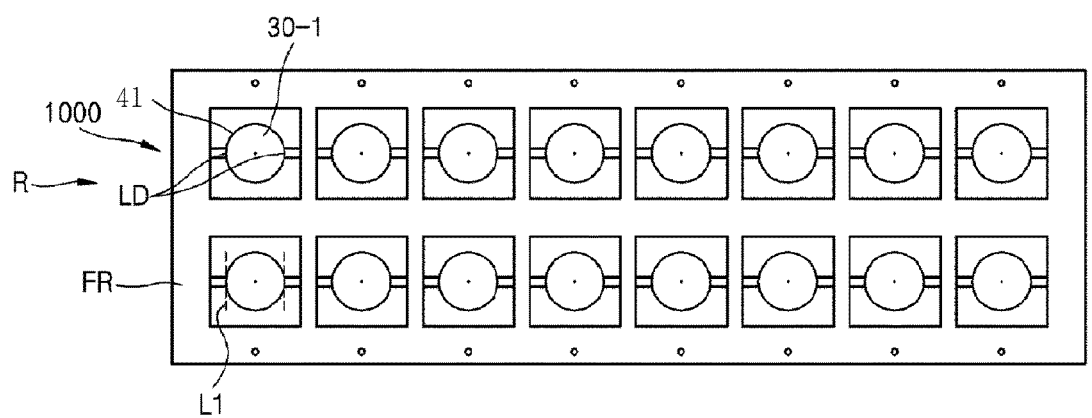
FIG. 26 is a plan view of the double cone-shaped reflector strip of FIG. 25.

FIG. 25 is a perspective view illustrating a double cone-shaped reflector strip 1000 according to some exemplary embodiments of the present invention, and FIG. 26 is a plan view of the double cone-shaped reflector strip 1000 of FIG. 25.

As illustrated in FIGS. 25 and 26, the double cone-shaped reflector strip 1000 according to some exemplary embodiments of the present invention, which is to facilitate en bloc simultaneous production of a plurality of double cone-shaped reflectors 30-3 of FIG. 12, may include a plurality of flange parts 41, a plurality of lead parts LD, a frame part FR, a plurality of first cone parts 30-1, and a plurality of second cone parts 30-2.

Here, the flange part 41 may have an opening 41a formed in the center thereof so that a molding material may pass therethrough, have a ring shape, and be a portion of a lead frame R.

In addition, the lead parts LD may be portions of the lead frame R connecting the flange parts 41 and neighboring flange parts 40 to each other so that a plurality of flange parts 41 may be connected to each other. The lead parts LD are cut, thereby making it possible to individually separate the double cone-shaped reflectors 30-3 from the frame part FR.

In addition, the frame part FR may be a portion of the lead frame R temporarily connecting the plurality of lead parts LD to each other.

Further, the first cone part 30-1 may be a molding part molded on the flange part 41 and sharp upward.

Further, the second cone part 30-2 may be a molding part installed below the first cone part 30-1 and sharp downward.

Here, the flange parts 41, the lead parts LD, and the frame part FR may be connected to each other to be formed integrally with each other, thereby configuring the lead frame R formed of a metal.

In addition, the first cone part 30-1 and the second cone part 30-2 may be molded to be connected to each other to be formed integrally with each other, and may be formed of a molding resin such as a white EMC, or the like.

Therefore, when the double cone-shaped reflector strip 1000 according to some exemplary embodiments of the present invention described above is used, the plurality of double cone-shaped reflectors 30-3 described above may be simultaneously produced en block, such that productivity may be maximized and a cost of a product may be decreased.

Figure 27:
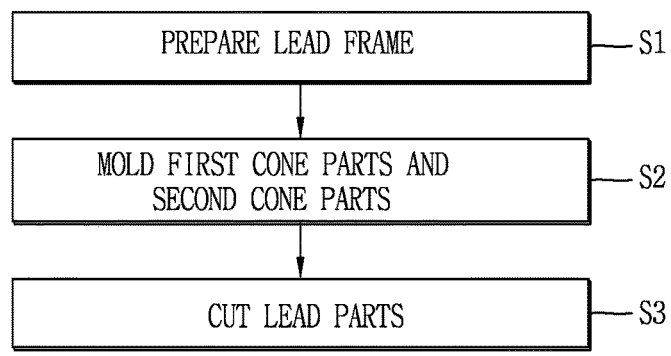
FIG. 27 is a flow chart illustrating a method of manufacturing a double cone-shaped reflector according to some exemplary embodiments of the present invention.

FIG. 27 is a flow chart illustrating a method of manufacturing a double cone-shaped reflector 30-3 according to some exemplary embodiments of the present invention.

As illustrated in FIGS. 26 and 27, the method of manufacturing a double cone-shaped reflector 30-3 according to some exemplary embodiments of the present invention may include a step (S1) of molding and preparing the lead frame R by a method such as pressing, extruding, die-casting, etching, punching, laser molding, or the like, the lead frame R including the flange part 41 having the opening 41*a* formed in the center thereof so that the molding material may pass therethrough and having the ring shape, the lead parts LD connecting the flange parts 41 and the neighboring flange parts 40 to each other so that the plurality of flange parts 41 may be connected to each other, and the frame part FR connecting the plurality of lead parts LD to each other, a step (S2) of molding the first cone parts 30-1 and the second cone parts 30-2 on and beneath the lead frame R, respectively, at the same time or different times, the first cone parts 30-1 being sharp upward and the second cone parts 30-2 being sharp downward, and a step (S3) of cutting the lead parts LD along cutting lines L1 of the lead parts LD of FIG. 26 using a cutting apparatus so that the flange parts 41 and the double cone-shaped reflectors 30-3 including the first cone parts 30-1 and the second cone parts 30-2 may be individually separated.

Meanwhile, although not illustrated, the present invention may include a backlight unit and an illumination apparatus including the double cone-shaped reflectors described above. Here, configurations and roles of components of the backlight unit and the illumination apparatus according to some exemplary embodiments of the present invention may be the same as those of the corresponding components of the double cone-shaped reflector according to the present invention described above. Therefore, a detailed description for these components will be omitted.

Although the present invention has been described with reference to exemplary embodiments illustrated in the accompanying drawings, it is only an example. It will be understood by those skilled in the art that various modifications and equivalent other exemplary embodiments are possible from the present invention. Accordingly, the actual technical protection scope of the present invention is to be defined by the following claims.

INDUSTRIAL APPLICABILITY

A high quality and good quality product may be produced.

The invention claimed is:
1. A backlight unit comprising:
a flat substrate;
a light emitting device mounted on the flat substrate;
a light guide plate being disposed on the flat substrate and including an inner wall surface, the inner wall surface defining a through-hole which accommodates the light emitting device;
a hollow reflector being inserted to be disposed in the through-hole and having a contacted reflection portion contacted to the light emitting device and a spaced reflection portion spaced from the light emitting device, wherein the hollow reflector is filled with an opaque material; and
a flange part formed on an upper surface of the reflector in a plate shape and contacting a surrounding part of the through-hole to fix the reflector to the through-hole of the light guide plate, wherein the contacted reflection portion and the spaced reflection portion are configured to reflect light generated in the light emitting device to penetrate into the light guide plate through the inner wall surface.

2. The backlight unit of claim 1, wherein the light guide plate includes a flange groove part formed at the surrounding part of the through-hole so that the flange part is seated therein.

3. The backlight unit of claim 1, wherein the reflector includes an inversed conical shape toward the light emitting device.

4. The backlight unit of claim 3, wherein the flange part includes a male screw part, and the flange groove part includes a female screw part which is engaged with the male screw part.

5. The backlight unit of claim 1, wherein the spaced reflection portion is configured to surround the contacted reflection portion.

6. The backlight unit of claim 5, wherein the contacted reflection portion is disposed to correspond to a center of a light emitting surface of the light emitting device.

7. The backlight unit of claim 5, wherein the spaced reflection portion has a symmetric shape with respect to the contacted reflection portion.

8. The backlight unit of claim 1, wherein the flat substrate includes a same area as that of the light guiding plate so as to be fully overlapped with the light guiding plate.

9. The backlight unit of claim 1, wherein each of the light emitting device and the through-hole includes a plurality of cones ones, and the plurality of cones form a lattice structure.

* * * * *